US007884024B2

(12) United States Patent
Le Roy et al.

(10) Patent No.: US 7,884,024 B2
(45) Date of Patent: Feb. 8, 2011

(54) APPARATUS AND METHOD FOR OPTICAL INTERFERENCE FRINGE BASED INTEGRATED CIRCUIT PROCESSING

(75) Inventors: Erwan Le Roy, Newark, CA (US);
Chun-Cheng Tsao, Cupertino, CA (US);
Theodore R. Lundquist, Milpitas, CA (US); Rajesh Kumar Jain, San Jose, CA (US)

(73) Assignee: DCG Systems, Inc., Fremont, CA (US)

( * ) Notice: Subject to any disclaimer, the term of this patent is extended or adjusted under 35 U.S.C. 154(b) by 877 days.

(21) Appl. No.: 11/754,466

(22) Filed: May 29, 2007

(65) Prior Publication Data

US 2007/0293052 A1    Dec. 20, 2007

Related U.S. Application Data

(60) Provisional application No. 60/803,318, filed on May 26, 2006.

(51) Int. Cl.
*H01L 21/302* (2006.01)
(52) U.S. Cl. .......................... 438/708; 438/16; 216/60
(58) Field of Classification Search .................. 438/16, 438/708; 216/60
See application file for complete search history.

(56) References Cited

U.S. PATENT DOCUMENTS

| 5,294,289 | A | * | 3/1994 | Heinz et al. ............... 216/60 |
| 5,298,365 | A | | 3/1994 | Okamoto et al. |
| 5,612,535 | A | * | 3/1997 | Wang ........................ 250/310 |
| 5,900,937 | A | | 5/1999 | Wang |
| 6,096,459 | A | * | 8/2000 | Yang ............................ 430/5 |
| 6,225,626 | B1 | * | 5/2001 | Talbot et al. .................. 850/62 |
| 6,955,930 | B2 | | 10/2005 | Le Roy et al. |
| 6,958,248 | B1 | | 10/2005 | Roy et al. |
| 7,115,426 | B2 | * | 10/2006 | Le Roy et al. ................. 438/16 |
| 7,177,030 | B2 | * | 2/2007 | Leizerson et al. ........... 356/504 |
| 2006/0188797 | A1 | | 8/2006 | Roy et al. |
| 2006/0244974 | A1 | | 11/2006 | Pfaff |
| 2007/0293052 | A1 | | 12/2007 | Le Roy et al. |

OTHER PUBLICATIONS

D.Petit et al. Review of Scientific Instruments, vol. 76, (2005), pp. 026105-1-026105-3.*

* cited by examiner

*Primary Examiner*—Lan Vinh
*Assistant Examiner*—Maki A Angadi
(74) *Attorney, Agent, or Firm*—Nixon Peabody LLP.; Joseph Bach, Esq.

(57) ABSTRACT

An apparatus and method for processing an integrated circuit employing optical interference fringes. During processing, one or more wavelength lights are directed on the integrated circuit and based upon the detection of interference fringes and characteristics of the same, further processing may be controlled. One implementation involves charged particle beam processing of an integrated circuit as function of detection and/or characteristics of interference fringes. A charged particle beam trench milling operation is performed in or on the substrate of an integrated circuit. Light is directed on the floor of the trench. Interference fringes may be formed from the constructive or destructive interference between the light reflected from the floor and the light from the circuit structures. Resulting fringes will be a function, in part, of the thickness and/or profile of the trench floor. Milling may be controlled as a function of the detected fringe patterns.

20 Claims, 24 Drawing Sheets

APPARATUS AND METHOD FOR OPTICAL INTERFERENCE FRINGE BASED INTEGRATED CIRCUIT PROCESSING

CROSS-REFERENCE TO RELATED APPLICATIONS

The present application is a continuation of and claims priority from U.S. provisional application No. 60/803,318, titled "Apparatus and Method for Optical Interference Fringe Based Integrated Circuit Processing" filed on May 26, 2006. The present application is further a continuation-in-part of and claims priority from U.S. non-provisional application Ser. No. 11/362,240 titled "Apparatus and Method for Optical Interference Fringe Based Integrated Circuit Processing," filed on Feb. 24, 2006, which is a non-provisional application claiming priority to provisional application No. 60/656,557 titled "Apparatus and Method for Optical Interference Fringe Based Charged Particle Beam Endpointing," filed on Feb. 24, 2005, the entire disclosures of all of which are hereby incorporated by reference herein.

FIELD OF THE INVENTION

Aspects of the present invention generally involve the field of integrated circuit processing, and more particularly involves optical interference fringe based integrated circuit processing, which may involve charged particle beam processing of an integrated circuit.

BACKGROUND

A newly-designed integrated circuit ("IC") is typically fabricated over a process of several weeks, involving preparation of silicon substrate wafers, generation of masks, doping of the silicon substrate, deposition of metal layers, and so on. The IC typically has various individual electronic components, such as resistors, capacitors, diodes, and transistors. The metal layers, which may be aluminum, copper, or other conductive material, provide the interconnection mesh between the various individual electronic components to form integrated electrical circuits. Vias formed of electrically conductive material often provide communication pathways between various metal layers. Contacts provide communication links between metal layer and individual electronic components.

Unfortunately, a new IC of any complexity rarely works as expected when first fabricated. Normally, some defects in the operation of the IC are discovered during testing. Also, some functions of the IC may operate properly under limited conditions, but fail when operated across a full range of temperature and voltage in which the IC is expected to perform. Once the IC has been tested, the designer may change the design, initiate the manufacture of a second prototype IC via the lengthy process described above, and then test the new IC once again. However, no guarantee exists that the design changes will correct the problems previously encountered, or that all of the problems in the previous version of the IC have been discovered.

Charged particle beam systems, such as focused ion beam ("FIB") systems, have found many applications in various areas of science and industry. Particularly in the semiconductor industry, FIB systems are used for integrated circuit probe point creation, failure analysis, and numerous other applications. Moreover, FIB systems may be used to edit a circuit ("circuit editing") to test design changes and thereby avoid some or all of the expense and time of testing design changes through fabrication. A FIB tool typically includes a particle beam production column designed to focus an ion beam onto the IC at the place intended for the desired intervention. Such a column typically comprises a source of ions, such as Ga+ (Gallium), produced from liquid metal. The Ga+ is used to form the ion beam, which is focused on the IC by a focusing device comprising a certain number of electrodes operating at determined potentials so as to form an electrostatic lens system. Other types of charged particle beam systems deploy other arrangements to produce charged particle beams having a desired degree of focus.

As mentioned above, IC manufacturers sometimes employ a FIB system to edit the prototype IC, thereby altering the connections and other electronic structures of the IC. Circuit editing involves employing an ion beam to remove and deposit material in an IC with precision. Removal of material, or milling, may be achieved through a process sometimes referred to as ion sputtering. Addition or deposition of material, such as a conductor, may be achieved through a process sometimes referred to as ion-induced deposition. Removal and deposition are typically performed in the presence of gas, such as $XeF_2$ for removal and platinum or tungsten organometallic precursor gases for deposition. Through removal and deposit of material, electrical connections may be severed or added, which allows designers to implement and test design modifications without repeating the wafer fabrication process.

Due to the increasing density of metal interconnections and number of metal layers, FIB based circuit editing through the topside of an IC is increasingly difficult. It is often the case that FIB milling to define access holes to reach a deep metal layer in the semiconductor structure would damage or destroy other structures or layers along the way. To avoid this, increasingly, FIB circuit editing is performed through the backside silicon substrate of the chip.

Conventionally, to access a target IC structure, a trench or hole is milled through the backside silicon substrate with the FIB beam in a raster pattern. Rastering the FIB beam occurs over anywhere from a 100 micrometer ($\mu m$)×100 $\mu m$ square to 350 $\mu m$×350 um square. However, with increasingly more dense device IC geometries, such sized FIB holes can affect the heat dissipation characteristics of the substrate. Moreover, the present inventors have recognized that a smaller raster pattern and hence a smaller trench can be completed more quickly, which decreases the time required for testing.

One particular problem with milling smaller trenches arises in determining when to stop a milling a procedure, often referred to as "endpointing." Optimally, the trench is milled so that the floor of the trench (the amount of silicon remaining between the trench and the underlying integrated circuit structures) is the proper thickness for subsequent operations. With larger trenches, such as those exceeding 100 micrometer ("$\mu m$")×100 $\mu m$, existing techniques, such as the voltage contrast technique discussed in U.S. Pat. No. 6,958,248 titled "Method and apparatus for the improvement of material/voltage contrast," by Le Roy et al, which is hereby incorporated by reference herein, work well. However, as trench sizes are reduced, existing endpointing techniques are sometimes insufficient or do not work at all, and result in either a trench that is too deep or too shallow. In such cases, the target structure may be destroyed or the target structure insufficiently exposed for subsequent endpointing techniques, circuit editing operations, imaging, etc.

Another endpointing procedure employs a technique referred to as optical beam-induced current ("OBIC") analysis. OBIC involves directing a laser on a junction area within a trench. The laser creates a current flow in the junction area. The magnitude of the current flow is a function of the amount of remaining silicon of the trench floor. OBIC works well when the number of junctions in the illumination area are well known, the silicon thickness versus current relationship is well characterized, and the beam can be controlled in order to illuminate a known number of junctions. As device geometry continually shrinks, the number of junctions in an area and the ability to illuminate known numbers of junctions becomes increasingly difficult, making OBIC more difficult to calibrate and use accurately for endpointing.

Thus, the efficiency and potential of charged particle beam, as well as other circuit editing and integrated circuit processing techniques are limited by the difficulty in determining when to stop a milling procedure and more generally the ability to control integrated circuit processing operations as the geometry of the working area continues to decrease.

Another problem encountered in some trenching procedures, with respect to any size trench, is the consistency of the trench floor thickness. Oftentimes the trench floor surface is uneven, which is often associated with inconsistencies in trench floor thickness. Uneven trench floors may be seen in focused ion beam systems employing a directional chemical jet configuration. The chemical jet injects various chemicals, such as $XeF_2$, that work with the focused ion beam to remove substrate material. An uneven trench floor, however, makes controlling final floor thickness difficult and sometimes impossible. Further, an uneven trench floor makes the formation of low aspect ratio trenches difficult.

SUMMARY

Aspects of the present invention may involve a method for removing material from an integrated circuit that comprises directing light on some portion of the integrated circuit and receiving reflected light from the portion of the integrated circuit. The method further involves detecting interference fringes formed from the reflected light. Finally, the method involves controlling removal of material from the portion of the integrated circuit as a function of the operation of detecting interference fringes. In one particular arrangement, the removal of material may be achieved through various means, including controlling an ion dose in a focused ion beam system as a function of surface profile and/or depth information obtained through analysis of detected fringe data.

BRIEF DESCRIPTION OF THE DRAWINGS

FIG. 21 illustrates the results of the simulation for bare silicon slab, while

DETAILED DESCRIPTION OF EMBODIMENTS OF THE INVENTION

Aspects of the present invention involve processing an integrated circuit, whether on a wafer, separated from the wafer, or in other forms, through generation of and characteristics of interference fringes. When processing an integrated circuit, which may involve mechanical milling, lapping, laser etching, chemical etching, polishing, charged particle beam processing, etc., light is directed on the integrated circuit to cause light to reflect from various features of the integrated circuit causing the interference fringe effect. Control of subsequent processing operations is a function of the detection or and/or characteristic of the interference fringes detected.

Generally, interference fringes are a function of light reflecting off of two closely spaced surfaces. In an everyday example, a person can witness an interference fringe effect in the rainbow like appearance from light reflecting from oil floating on water. Some of the light reflects off of the oil, and some light propagates through the oil and reflects off the underlying water. The light waves reflecting from the oil and water can constructively or destructively interact to cause the colorful bands in many patterns.

Figure 1:
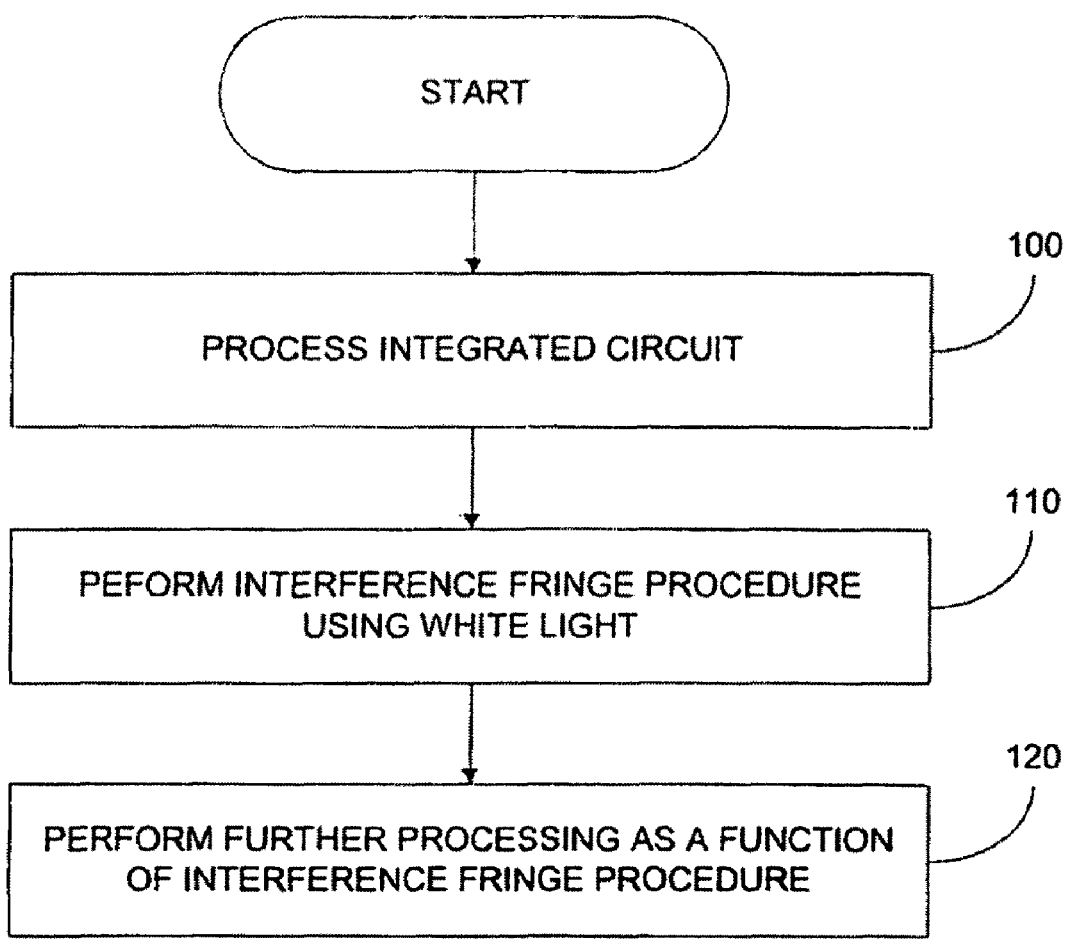
FIG. 1 is a flowchart illustrating one method of optical interference fringe processing of an integrated circuit, in accordance with aspects of the present invention.

Referring first to FIG. 1, in accordance with aspects of the present invention, some form of integrated circuit processing is undertaken (operation 100). As mentioned above, various forms of integrated circuit processing may be undertaken, including but not limited to, charged particle beam processing (e.g., FIB, electron beam, etc.), mechanical milling, which may involve only a portion of the substrate or the entire surface, lapping, laser etch, and chemical etch. The IC may be processed in order to test, characterize, or view some or all of the IC, or it may be processed for other reasons such as thinning silicon for smart cards, stacked die, as well as others. During the procedure, whether continuously, at discrete intervals, while the procedure is being undertaken or at breaks in the procedure, light is directed on a portion of the integrated circuit being processed in order to generate interference fringes (operation 110). The light may be filament bulb light, laser light, light emitting diode light, and in various wavelengths, depending on the surface being processed, structures within the integrated circuit, and other factors that may effect the light propagation through the surface and reflection both from the surface and underlying structures, as well as other factors. In one example, interference fringes are formed from the constructive or destructive interference of light reflecting from the surface and light reflecting from some structure, surface, boundary, etc., of the integrated circuit below the surface. Further processing of the integrated circuit is performed as a function of the interference fringe procedure (operation 120). The characteristics of the fringes, brightness, spacing, pattern, presence, absence, etc., will depend on the surface and the underlying structure and the wavelength of light; thus, because the wavelength is known, the characteristics of the fringes will provide information about both the surface being processed as well as the underlying structures, surfaces, etc.

One more particular aspect of the present invention involves an apparatus and method for determining when to stop milling, charged particle beam processing, lapping or other form of integrated circuit substrate or other feature removal procedure based upon the generation and detection of optical interference fringes. During charged particle beam, mechanical, or other type of milling procedure, light is guided into a trench formed by the charged particle tool. In this example, a trench is formed through the backside integrated circuit substrate; however, it is also possible to process the front-side of the integrated circuit. Rastering the charged particle beam is commonly employed to form a trench. Prior to milling a trench, the substrate may be polished to a reduced thickness, such as 10 µm to 50 µm. Typically, at the start of the milling procedure, with perhaps a silicon substrate that is 10 or more micrometers thick, no interference fringes are detected when light is directed on the trench floor. However, with implementations set forth herein, it is possible to polish or lap the substrate to a thinner dimension than currently available such that interference fringes would be detected. Thus, it is possible to employ techniques set forth herein in a polishing or lapping environment.

As the trench is milled deeper into the substrate and gets closer to various circuit structures formed in and on the substrate, light directed on the trench will generate interference fringes which can be detected using a filter, such as a 500 nm filter with a 70 nm bandwidth, and used to determine when to stop a milling procedure, in conformance with aspects of the present invention.

Figure 2:
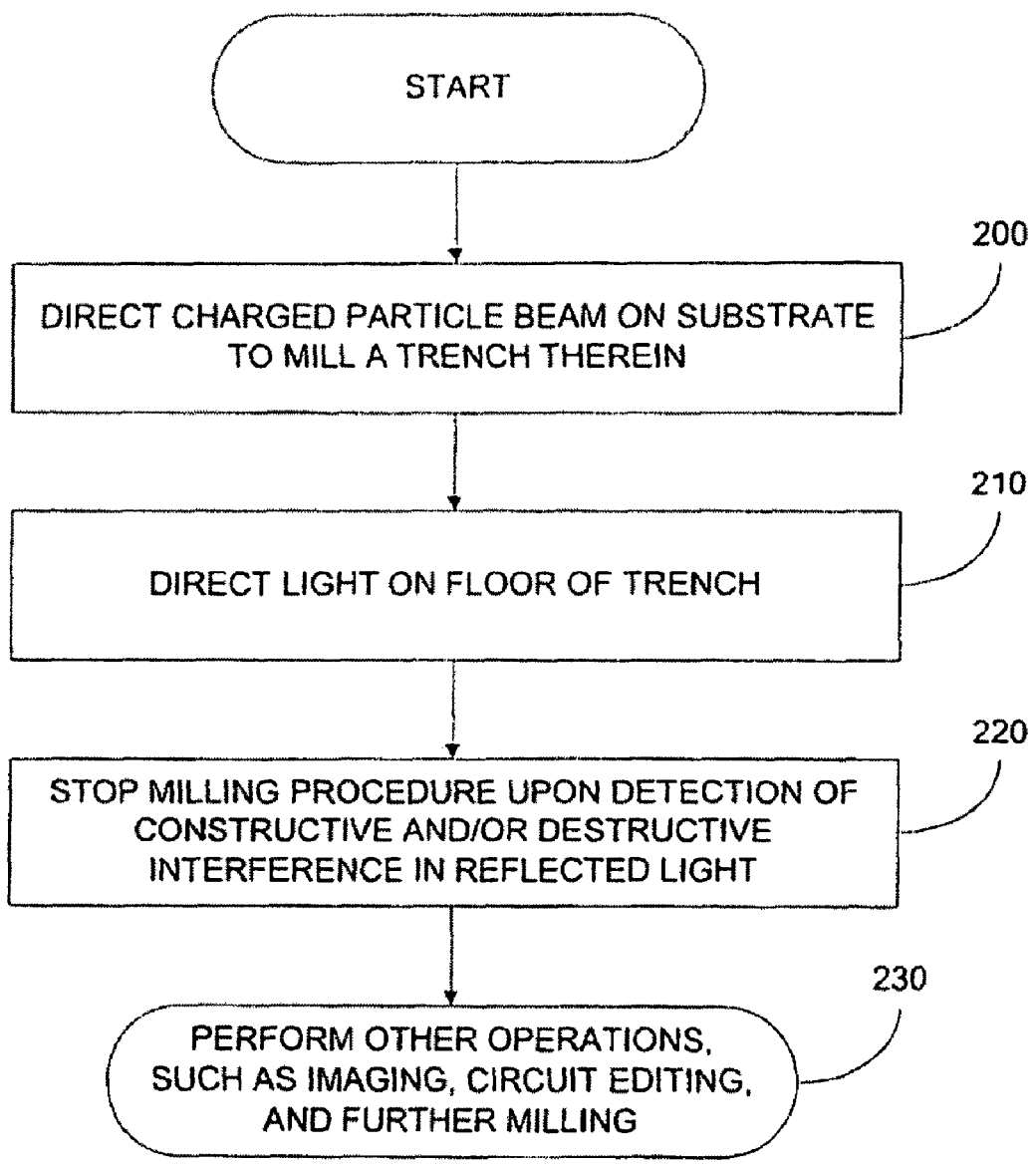
FIG. 2 is a flowchart illustrating one method for charged particle beam endpointing through generation and detection of optical interference fringes, in accordance with aspects of the present invention.

Referring now to FIG. 2, in accordance with one particular aspect of the present invention, a charged particle beam, such as a FIB, is directed on a substrate, or other portion of an integrated circuit to mill a trench (operation 200). Trenches are formed to access circuit structures in order to probe the circuit to detect signals, to make a connection, to break a connection, etc. During the milling operation, light is propagated on the trench floor (operation 210), which reflects off of the bottom of the trench. Initially, in the formation of the trench when the separation between the trench floor and underlying structures is relatively large, it is possible that no fringes will be detected. As the depth of the trench increases and hence the trench floor approaches the circuit structures, some light propagates through the silicon and reflects off of the underlying circuit structures. The interaction of the light reflecting from the bottom of the trench and the light reflecting from underlying circuit structures causes constructive and/or destructive interference between the reflected light. As such, upon detection of, or at some time thereafter, interference fringes, a charged particle beam milling operation can be stopped (operation 220). Once the trench is properly formed, other operations may be conducted, such as imaging, circuit editing, and additional milling (operation 230).

One advantage of a white light source over other light sources is that it covers the visible to infrared spectra. Thus, a white light source in conjunction with bandpass filtering allows for a wide possible spectral range. While possible to employ LED or laser, LED has a much narrower spectral range, about 20-50 nm, and laser is a single wavelength.

Figure 3:
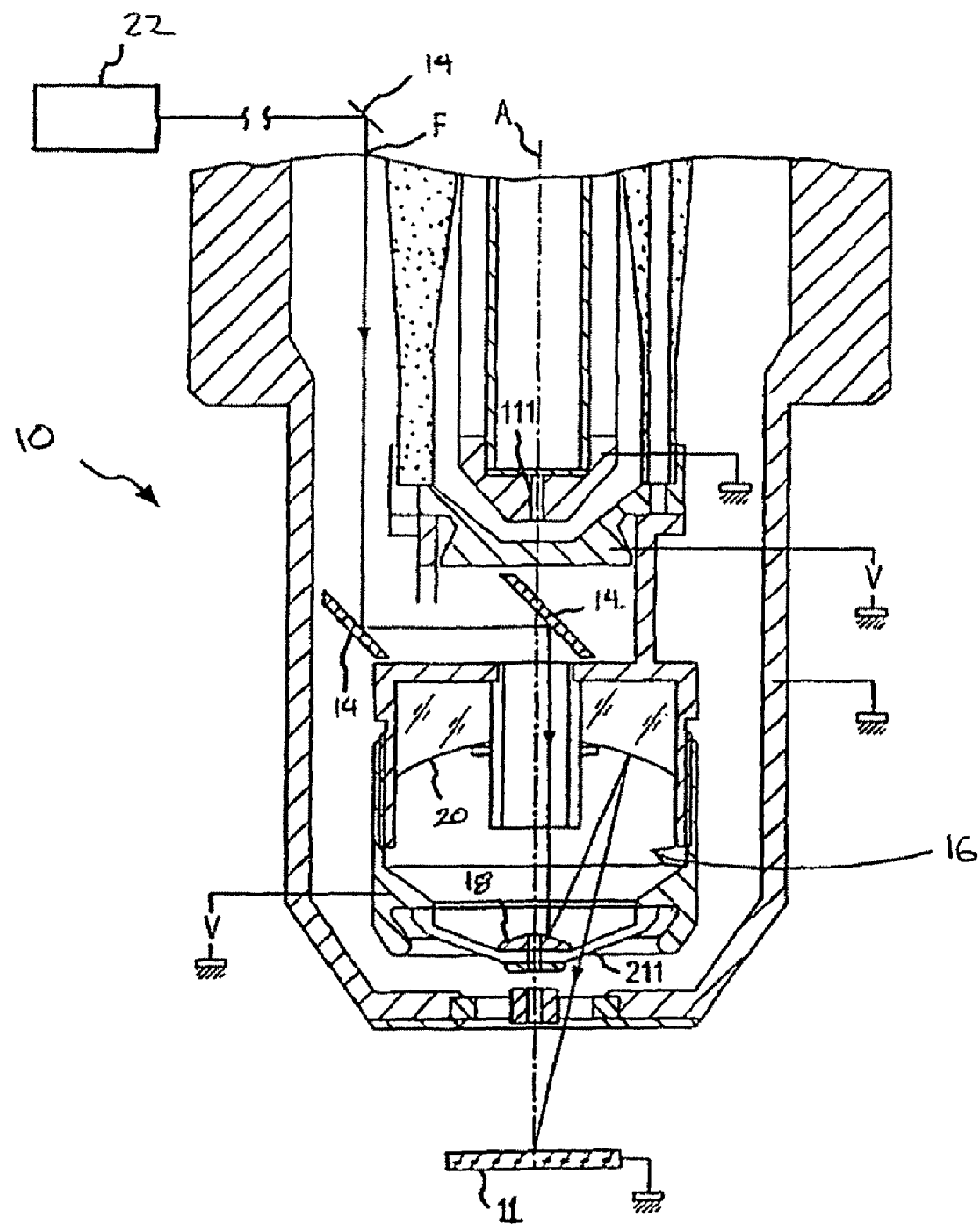
FIG. 3 is a section view of a focused ion beam tool having a focused ion beam structure and optical structure for generation and detection of optical interference fringes, in accordance with aspects of the present invention.
Figure 4:
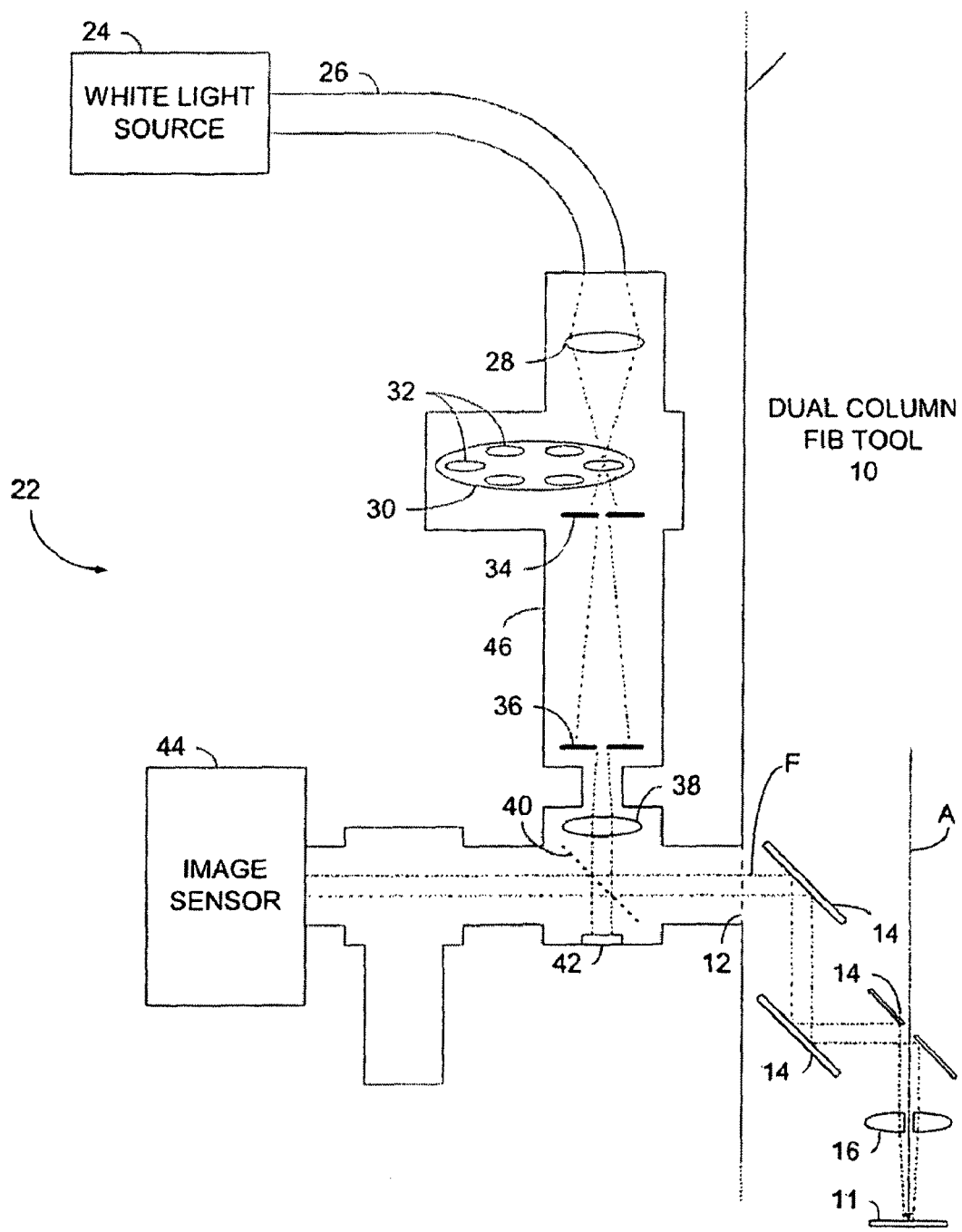
FIG. 4 is a schematic diagram of the focused ion beam tool of FIG. 3, emphasizing the optical structure for generation and detection of optical interference fringes.

FIG. 3 is a section view of a FIB tool 10 having an ion beam path A and an optical path F. FIG. 4 is a schematic diagram of an optical assembly and a portion of the focused ion beam tool. Various implementations of the invention are discussed herein with reference to focused ion beam type charged particles tools; however, other charged particle tools, such as electron beam (e-beam) and the like may also be adapted to conform to aspects of the present invention. Moreover, other integrated circuit processing tools such as laser beam, plasma beam, milling tools, grinding tools, chemical mechanical polishing tools, and the like may be configured in accordance with aspects of the present invention.

The FIB tool is configured to perform interference fringe generation and detection, in accordance with aspects of the present invention. The ion beam path A is adapted to direct an ion beam to an IC 11 for purposes of circuit editing, milling, secondary electron imaging, etc. The optical path F directs light to and from the IC for illumination and imaging purposes. Additionally, the optical path directs light to and from the target portion of an IC to perform optical interference based endpointing and other interference fringe processing in accordance with various aspects of the present invention. One such FIB tool that may be configured in accordance with aspects of the present invention is shown and described in U.S. patent application Ser. No. 10/239,293 (Publication No. US2003/0102436) titled "Column Simultaneously Focusing a Particle Beam and an Optical Beam" filed on Mar. 19, 2001, which is hereby incorporated by reference herein. The FIB tool set forth in the '293 application includes integrated optics; however, it is possible to employ a FIB tool that does not include integrated optics. U.S. patent application Ser. No. 11/222,932 titled "Optical Coupling Apparatus for a Dual Column Charged Particle Beam Tool for Imaging and Forming Silicide in a Localized Manner," filed Sep. 8, 2005, describes various focused ion beam arrangements with light provision arrangements that may be configured to perform various aspects of the methods set forth herein.

Within the column of the FIB tool, a series of mirrors direct light between an optical port 12 located along a side of the column and an objective lens arrangement located at the distal end of the optical path. The optical path includes mirrors 14 and the objective lens 16. In one example, the objective lens includes a convex mirror 18, and a concave mirror 20 adapted to convey and focus an optical beam to and from the IC 11. The optical path shown in FIGS. 3 and 4 is but one possible path, and other optical configurations are possible. For purposes of imaging and interference endpointing, the objective lens is arranged to focus light on the target IC and receive reflected light from the target IC.

An optical assembly 22 is coupled with the optical port. The optical assembly is adapted to couple light with the optical path F, and to image reflected light received from the target IC. The light received from the target IC will display interference fringes when the floor of a trench being milled approaches the underlying circuit structures.

Referring to FIG. 3, the optical assembly 22 includes a "flood" illumination and imaging configuration for detection of interference fringes in order to determine when to stop a milling/trenching operation. The optical coupling apparatus includes a white light source 24, which may be, for example, a xenon (Xe) or halogen lamp, optically coupled by way of a fiber bundle 26 to a condenser lens 28. It is also possible to employ a light emitting diode, laser, or other light source. The fiber bundle 26 provides an optical conduit by which substantially all of the light emitted by the white light source 24 is transmitted to the condenser lens 28. The condenser lens 28 converges the light received from the fiber bundle 26 onto a selectable optical bandpass filter 30, which allows passage of a portion of the frequency spectrum of the light. In one example, the optical bandpass filter 30 takes the form of a filter wheel, about which one or more filter windows 32 are provided, with each window 32 allowing the passage of a different portion of the spectrum exhibited by the light beam. To select a particular window, the filter wheel 30 is rotated so that the desired window 32 lies within the light beam from the condenser lens 28. For imaging, the selectable nature of the optical filter wheel 30 allows the use of diverse light wavelengths in an effort to provide high contrast images of the various features of the IC 11 being imaged. In alternative embodiments, the optical bandpass filter may not be selectable, thus permitting a predetermined portion of the frequency bandwidth to pass therethrough. For interference fringe generation/detection, in one implementation, bandpass filters are included in the filter wheel 30 to pass various wavelengths of light particularly suited to cause interference fringes from the silicon/circuit boundary region. In one particular implementation, a filter adapted to pass 500 nanometer (nm) wavelength light is employed. 500 nm mediumband or narrowband bandpass filters may be employed in embodiments of the present invention.

After the light beam from the condenser lens 28 has passed through the selectable optical bandpass filter 30, an aperture stop 34 controls the size of the beam. Generally, a stop is an aperture residing within an opaque screen. Typically, the aperture stop 34 is embodied as an adjustable iris mechanism which provides an aperture of a user-selectable diameter through which the beam passes. The aperture stop 34 thus adjustably limits the angle of rays diverging from the optical bandpass filter 30, thus limiting the size and brightness of the beam. Brightness control aids in imaging a variety of IC structures and surfaces, each possessing its own reflectivity characteristics.

After exiting the aperture stop 34, the light beam encounters a field stop 36. In one embodiment, the field stop 36, similar in structure to the aperture stop 34 described above, provides an iris of adjustable diameter. As a result, the field stop 36 provides a mechanism which controls the size of the resulting image of the IC and the area being lit for interference purposes by controlling the amount of IC area being illuminated. Alternatively, the field stop 36 can be fixed.

Upon exiting the field stop 36, the light beam encounters a field lens 38, which collimates the diverging light from the aperture stop 34 and the field stop 36, thus yielding a collimated illumination beam whose individual rays are substantially directed parallel to each other. The collimated illumination beam then encounters a beam splitter 40. The beam splitter 40 is adapted to direct a significant portion of the collimated illumination beam (for example, 50%) through the port 12 of the FIB tool 10, after which the beam is directed along the optical path F toward the IC, such as by way of the one or more mirrors 14, and the objective lens 16. That portion of the collimated illumination beam not directed by the first beam splitter 40 toward the port 12 of the dual column tool 16 passes through the first beam splitter 40 and impinges a beam trap 42, which substantially prohibits reflection of that portion of the collimated illumination beam toward any other portion of the optical path of the optical coupling apparatus 22.

A portion of the illumination beam incident upon the IC is reflected from the IC 11. While milling the trench with the FIB beam, the resulting reflected light may be characterized as an endpointing beam. After the endpoint is detected and milling is complete, the resulting reflected light may be characterized as an imaging beam, which imparts information concerning structural and compositional features of the IC 11 illuminated by the illumination beam. Both the endpointing and imaging beam are in many ways the same. However, for purposes of this application, the endpointing beam is processed or used to operate and detect interference fringes whereas the imaging beam is processed or used to view the structure of the IC exposed in the trench. Further, as discussed in more detail below, the image can be used to align the FIB for further pinpoint milling, deposition, and the like. The endpointing and imaging beams reflected from the IC are directed by the objective lens 16 toward the one or more mirrors 14, which direct the imaging beam toward the port 12.

Upon exit from the FIB tool 10, the endpointing and imaging beam encounter the first beam splitter 40, which is configured to allow about 50% of the endpointing and imaging beams to pass therethrough. The endpointing or imaging beam are then accepted by an image sensor 44, such as a charge-coupled device (CCD) camera, which produces an electronic image of the illuminated portion of the trench or IC from the endpointing or imaging beams, respectively. Interference fringes may be seen in the image by the user as concentric rings of differing contrast or color, as waves or shimmers of differing contrast or color, or other manifestation of the interference fringes. Before the appearance of fringes, the image is typically a fairly uniform grey. As the trench is milled in the silicon substrate and gets closer to the underlying circuit structure, constructive and destructive interference typically occurs, causing the visible, albeit possibly faint, appearances of interference fringes in the image of the trench.

Figure 5:
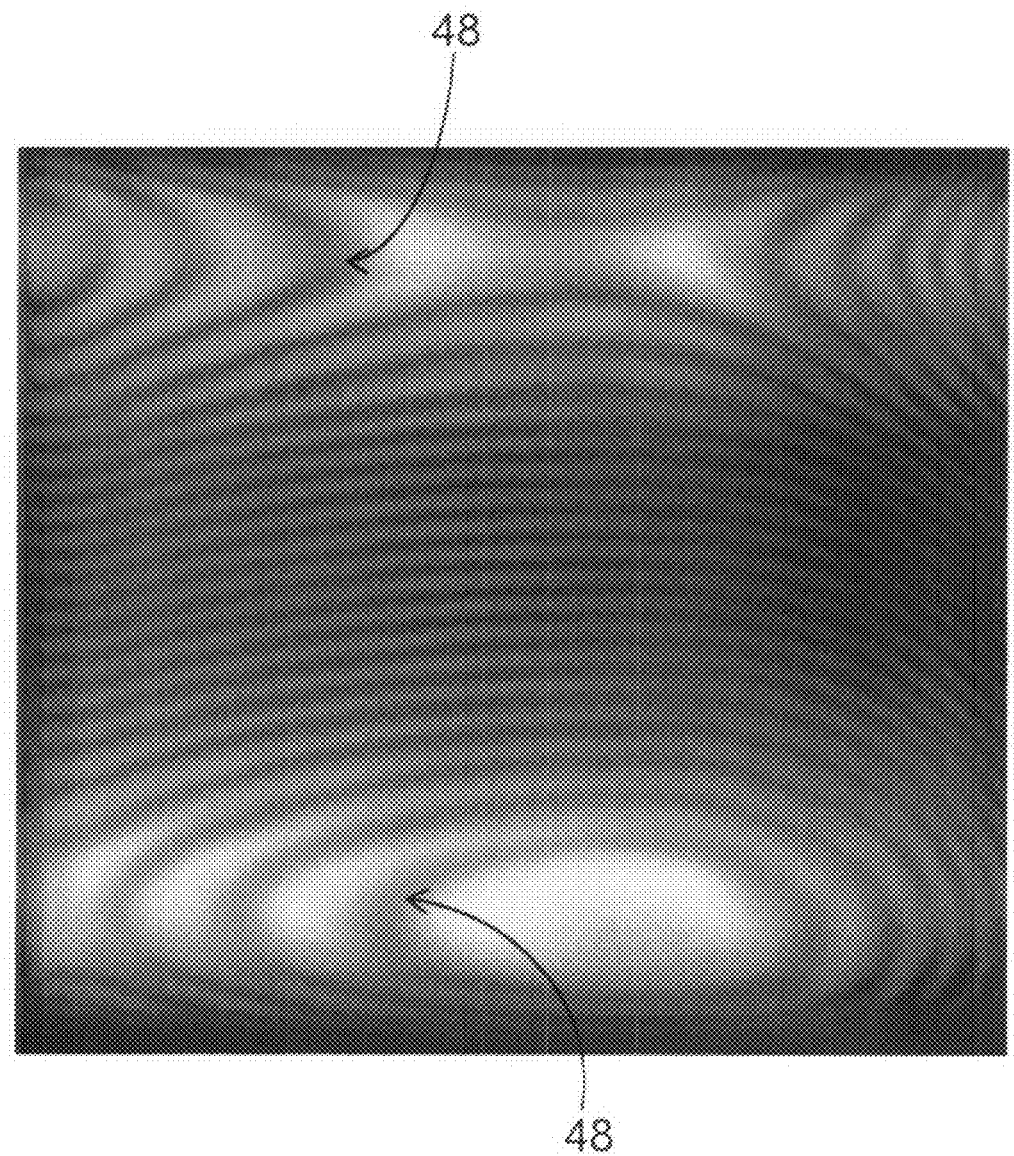
FIG. 5 is a representative image of interference fringes generated and detected for charged particle beam endpointing, in accordance with aspects of the present invention.

FIG. 5 is a representative image of interference fringes. In the image, the fringes 48 are identified by the darker areas. There are fringes present for each wavelength period of separation between the surface and the underlying surface. As such, the pattern, separation, and number of fringes reflects the spatial relationship between the trench floor surface and the underlying features. In the example of forming a trench and using 500 nm wavelength light, there is a fringe present for any difference of 500 nm between the trench floor and the underlying structure. Thus, for example, if one fringe represents 5000 nm separation between the trench floor and the underlying structure, then an adjacent fringe either represents 4500 nm or 5500 nm separation.

In one embodiment, an opaque enclosure 46 is employed throughout the endpointing and imaging paths of the optical coupling apparatus 22 to protect the paths from ambient light, particulate matter, and other contaminants that may adversely affect the various components of optical coupling apparatus 22, or the illuminating, imaging and endpointing beams.

Figure 6:
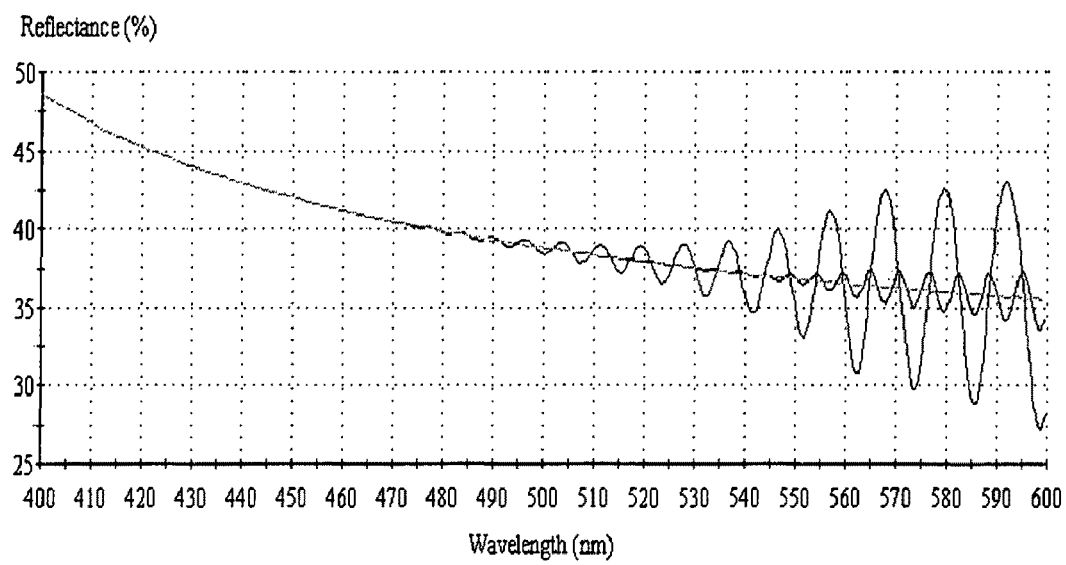
FIG. 6 is a graph illustrating reflectance characteristics for various wavelengths of light at a 2.5 micrometer trench floor thickness, 5 micrometer trench floor thickness, and 10 micrometer trench floor thickness

FIG. 6 is a graph illustrating the reflectance characteristics of certain wavelengths of light at certain trench floor thicknesses, namely 2.5 μm silicon trench floor thickness 54, 5.0 μm silicon trench floor thickness 52, and 10 μm silicon trench floor thickness 50. The graph illustrates the reflectance characteristics exhibited at boundaries between air, silicon and silicon oxide portions of the integrated circuit. As used herein, the phrase "trench floor thickness" refers to the thickness of the remaining silicon substrate in the floor of a milled trench. The silicon substrate floor separates the trench from the underlying circuit structures formed in the silicon oxide portion of the IC. The trench, trench floor, circuit structures, and the like are discussed in greater detail below with respect to FIGS. 7-12.

The graph illustrates that with a 500-600 nanometer wavelength light, little interference fringes are generated when the trench has approximately a 10 μm silicon trench floor thickness. Interference fringes become more visible at about 5 μm floor thickness and interference fringes become quite distinct at about 2.5 μm silicon floor thickness. In one implementation, 500 μm white light is chosen so that fringes appear at about 2.5 μm floor thickness. Other wavelengths may be chosen for other desired floor thicknesses. Thus, by detecting the amplitude and/or intensity of interference fringes, one viewing an image of the trench can begin to faintly detect interference fringes at approximately 2.5 μm of remaining silicon. In many cases, well structures, such as n-wells, are as deep as about 4 μm in the substrate, below the circuit structures. As such, at the 2.5 μm depth of remaining silicon, the milling procedure will have begun to enter into the n-well regions of the underlying circuit structures. Note, in the drawings of FIGS. 7-9 and 11-12, the backside surface of substrate is shown at the top of the drawings. Different light wavelengths and filter bandwidths may be chosen to cause the appearance of interference fringes depending on the material thickness, the material types targeted, etc. Moreover, as shown in the graph, by adjusting the wavelength of light, it is possible to adjust at what trench floor thickness fringes will appear. Generally, by increasing wavelength, fringes will appear at increasing floor thickness. As will be discussed in further detail below, further imaging preparation can be performed with the exposed wells to image and identify the circuit structures immediately below the trench floor.

Figure 7:
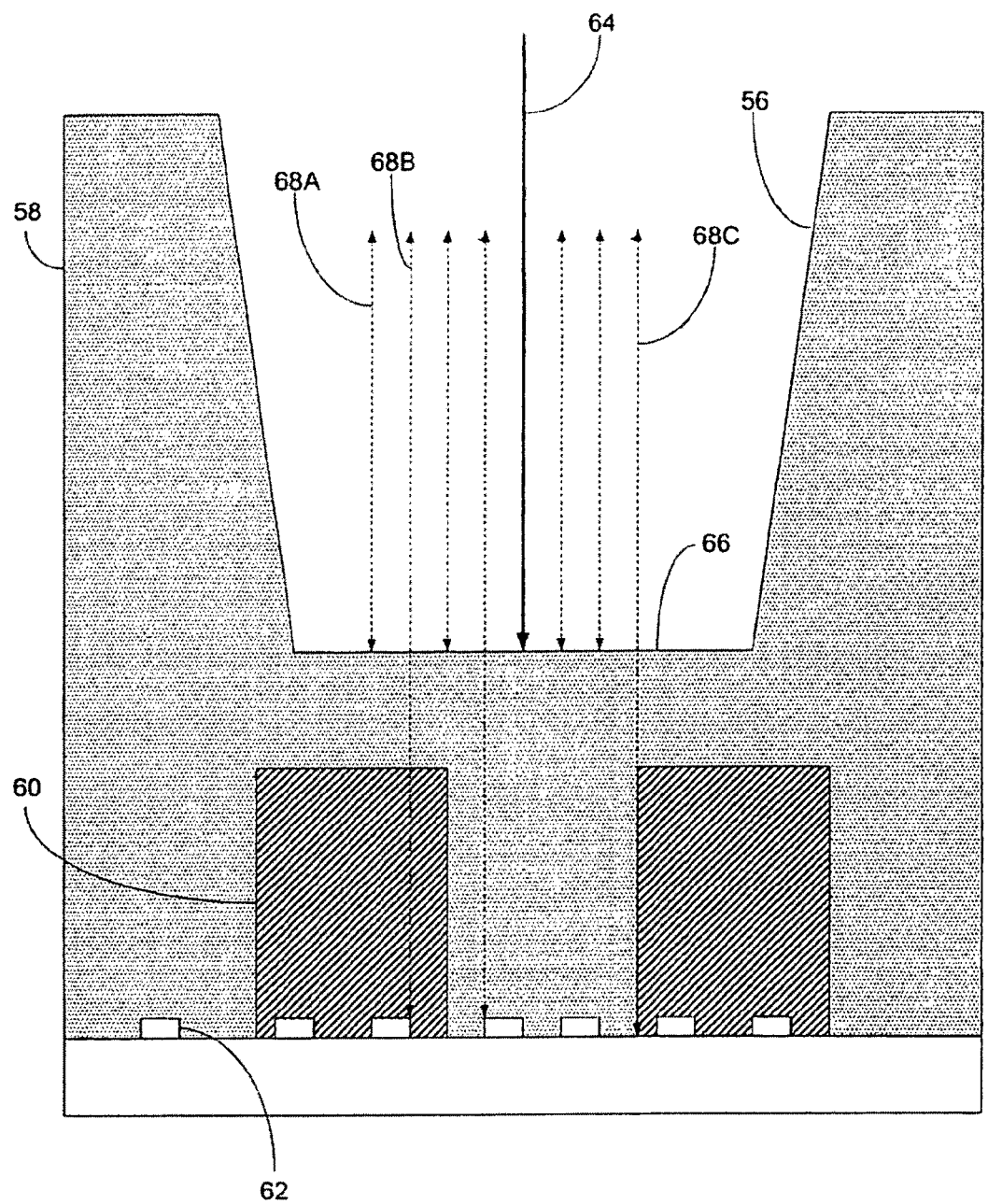
FIG. 7 is a representative section view of a charged particle beam milled trench in the substrate of a semiconductor integrated circuit.

FIGS. 7-12 illustrate various examples of a trench 56 formed in the silicon substrate 58 of an integrated circuit. FIGS. 7-12 further illustrate underlying n-wells 60, metal interconnects 62 and other features forming various layers and functional structures of an IC. Referring first to FIG. 7, a trench 56 is shown milled into the silicon substrate 58 of an integrated circuit. As mentioned above, a focused ion beam 64 is used to mill the trench. The focused ion beam may be moved from point to point in a raster pattern along a floor 66 of the trench. Light 68 is directed into the trench from the optical assembly 22 and follows the light path F. In the example of FIG. 7, there is approximately 3 μm of remaining silicon between a floor of the trench and the circuit structure (a 3 μm trench floor thickness). As such, some light (68A) is reflected from the floor of the trench. Additionally, some of the light (68B, 68C) passes through the silicon and is reflected off the underlying circuit structure. Reflections off the underlying metal dominates reflection variations between p and n dopant variations. The light reflected from the trench floor and the light reflected from the underlying circuit generates interference fringes as discussed above. The reflected light, whether it's from the floor of the trench or from the underlying circuit travels up the optical path and is received by the imaging electronics. As such, with a 3 μm silicon trench floor thickness, a user will see interference fringe effects. From the presence of interference fringes, the FIB user understands that the trench is approaching the underlying circuit structure, and may stop milling at any time.

Figure 8:
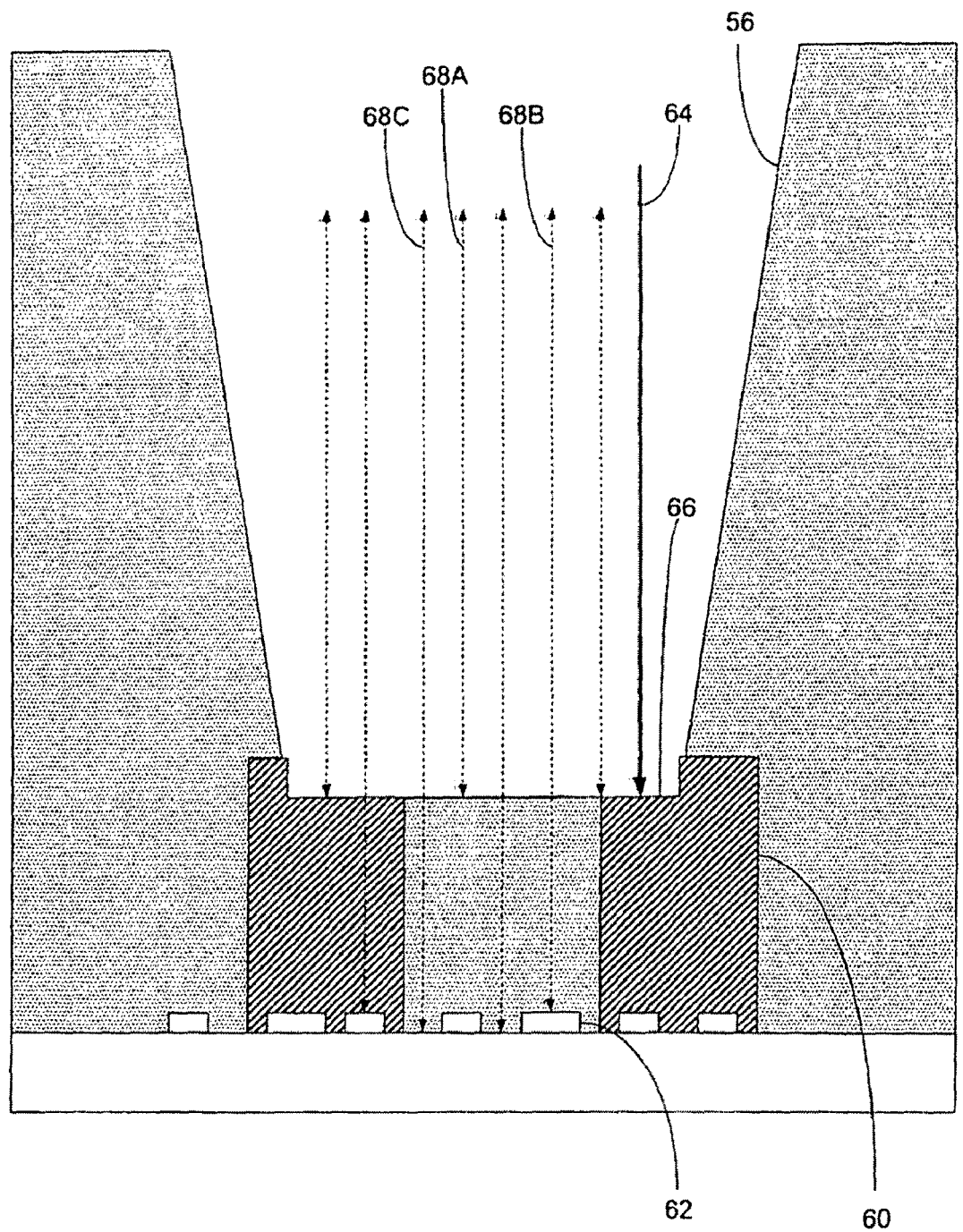
FIG. 8 is a representative section view of a charged particle beam milled trench in the substrate of a semiconductor integrated circuit of FIG. 7, with the milling operation within the n-wells of various circuit structures.

Referring now to FIG. 8, the trench 56 has been further milled by the FIB 64, and the floor 66 has approximately a 2.5 3 μm floor thickness. As such, interference fringe effects are becoming more intense and the user may decide to stop the milling procedure due to the intensity of the interference fringes. As can be seen from FIG. 8, the FIB trench has now begun to penetrate into the n-wells 60 of the circuit structures. P-diffusion regions may also be seen in the substrate and in the n-wells.

Figure 9:
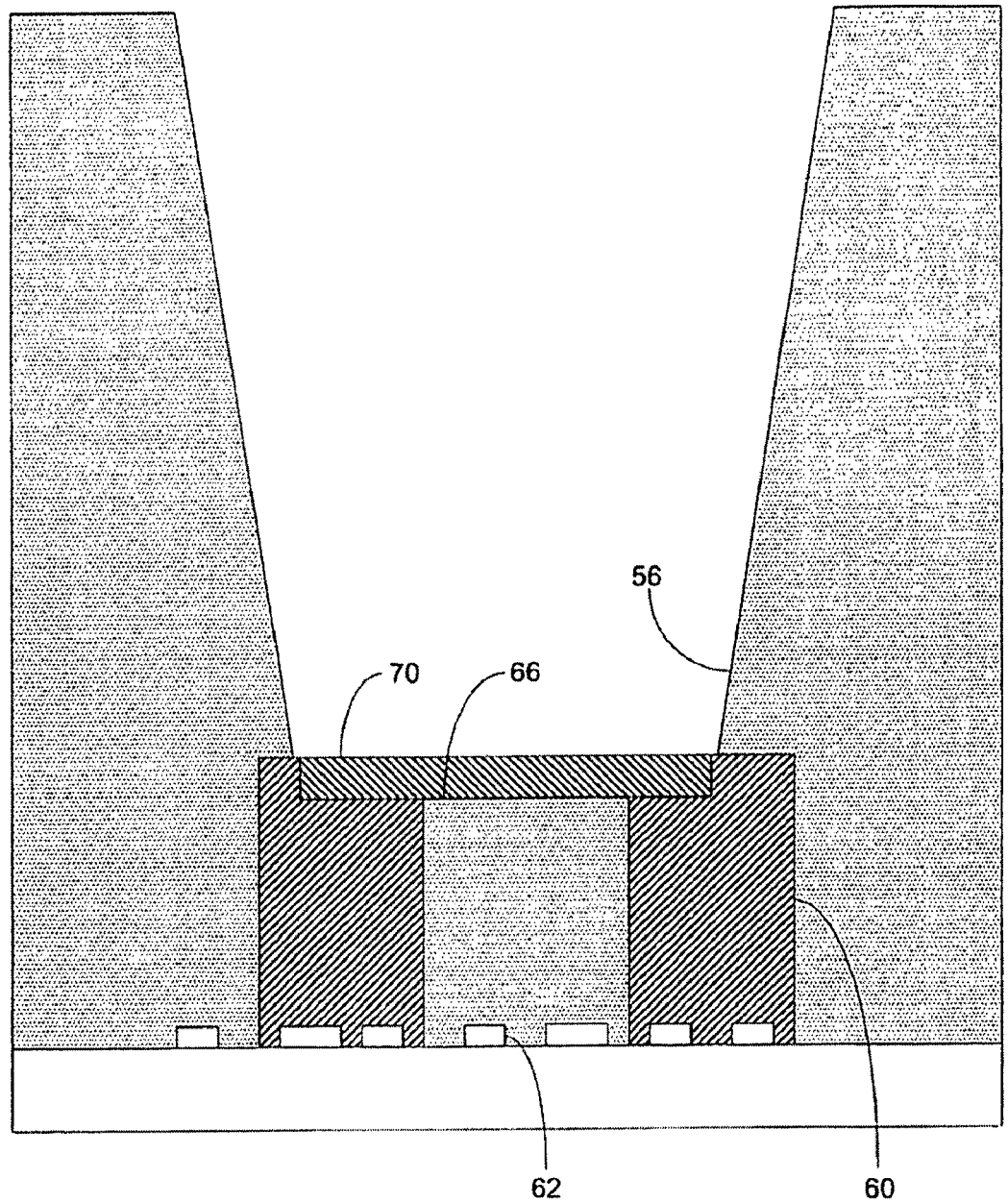
FIG. 9 is a representative section view of a charged particle beam milled trench in the substrate of a semiconductor integrated circuit of FIG. 8, with an oxide layer deposited on the floor of the trench for purposes of voltage contrast imaging, in accordance with aspects of the present invention.

FIG. 9 illustrates a FIB trench 56 with a thin deposition of oxide film 70, such as 130 nanometers (nm), on the floor 66 of the trench. In accordance with the teachings of U.S. Pat. No. 6,958,248, referenced above, enhanced imaging of the circuit structure, particularly n-wells, can be facilitated through the deposition of oxide and the employment of focused ion beam secondary electron imaging. In such a procedure, the focused ion beam is used to deposit oxide on the floor of the trench. The focused ion beam, at about 30 keV, is then trained upon the deposited oxide and secondary electrons are generated by the impact of the focused ion beam. Other processing steps such as removal of gallium ions implanted in the silicon, may be necessary for contrast imaging. In such a manner, the shape and contrast between n-wells in comparison to the surrounding substrate can be enhanced dramatically so that the user can image the n-wells and p-substrate from that information and obtain a precise understanding of the location and type of certain structures underlying the trench floor. With such information, a user may then perform additional circuit editing techniques such as milling a pinpoint hole to various metal layers and creating connections therebetween.

It is possible to employ the fringe based endpointing and other techniques discussed herein in conjunction with the voltage contrast technique, However, the endpointing and other fringe based processing methods may be used alone and in various applications not related or involving the voltage contrast techniques.

Figure 10:
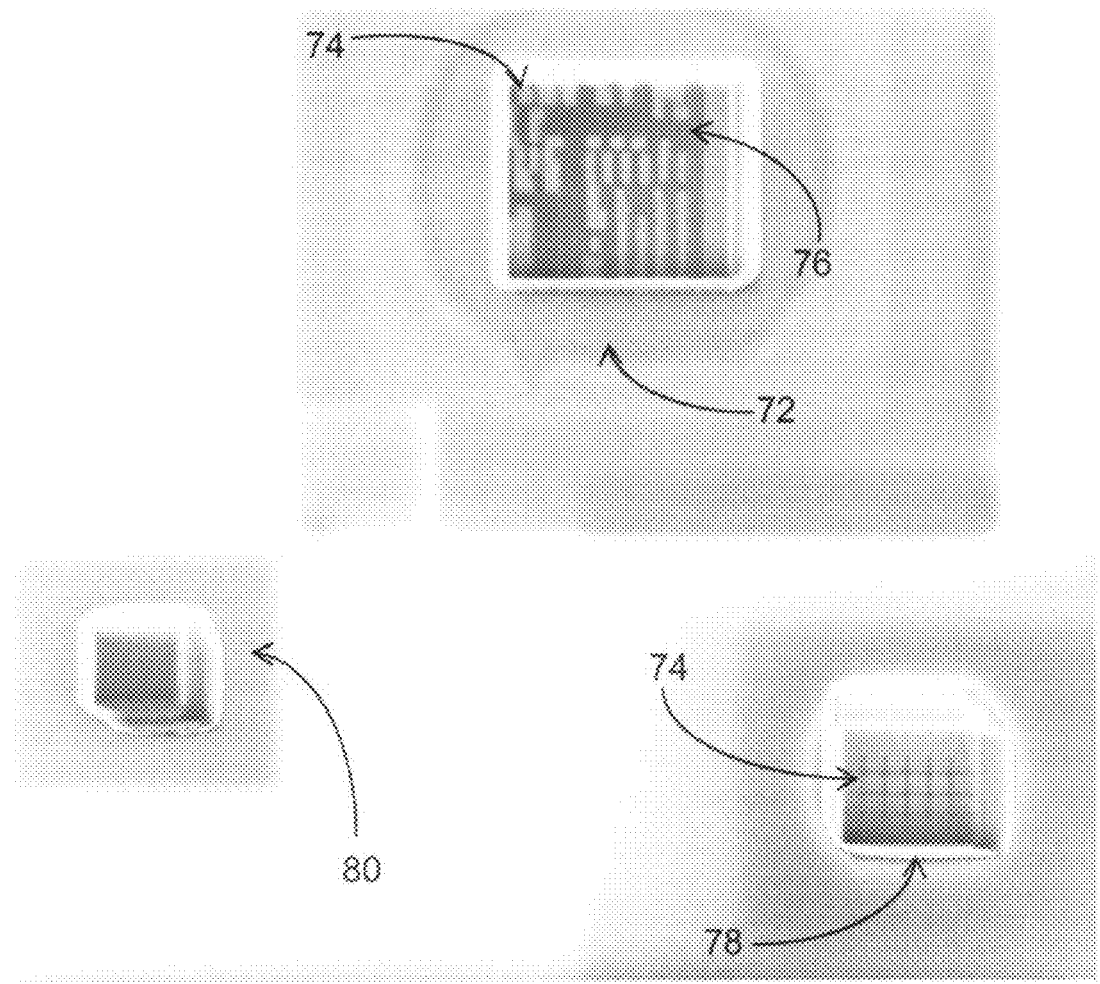
FIG. 10 illustrates three representative images of a 50×50 micrometer trench, a 30×30 micrometer trench, and a 20×20 micrometer trench, milled and processed in accordance with aspects of the present invention.

FIG. 10 illustrates images of circuit configurations revealed by forming relatively small trenches in an IC substrate. The top trench 72 is about 50 µm×50 µm, and was milled to about 2-3 µm floor thickness using the interference fringe endpointing technique described herein. The floor was then coated with an oxide film and voltage contrast imaging performed. The relatively light structures 74 are n-wells, and the dark area 76 is p-substrate. The bottom right trench 78 is 30 µm×30 µm, and was milled to about 2 µm floor thickness using the interference fringe endpointing technique described herein. With the voltage contrast technique, n-wells 74 surrounding in a substrate grid pattern are clearly shown. Finally, the bottom left trench 80 is 20 µm×20 µm and was milled to a floor thickness of about 2-3 µm using the interference fringe endpointing technique described herein. N-wells may also be seen in the trench. As mentioned above, voltage contrasting techniques can be used for endpointing. However, as the size of the trench floor is decreased to, or below, 50 µm×50 µm existing endpointing techniques are insufficient. The interference fringe endpointing technique, according to aspects of the present invention, may be used to perform endpointing in trenches that are 50 µm×50 µm and less, as well as larger trenches.

Figure 11:
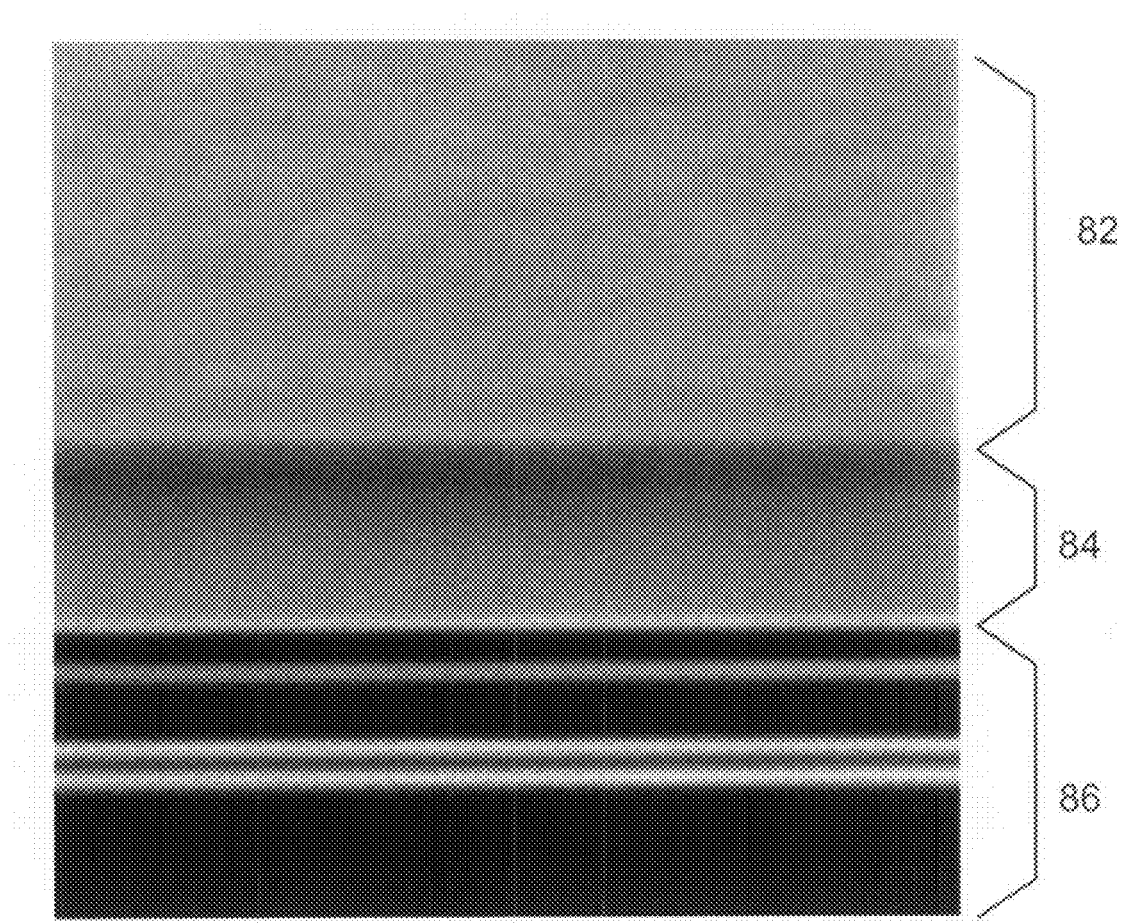
FIG. 11 is a representative image of a small portion of a trench having about a 2.3 micrometer floor thickness, milled in accordance with aspects of the present invention.

FIG. 11 is a close-up section view of a trench 82, floor 84, and underlying circuit structure 86, tilted 45°. In this example, the floor thickness was milled to about 2.3 µm using the interference endpointing technique of the present invention.

Figure 12:
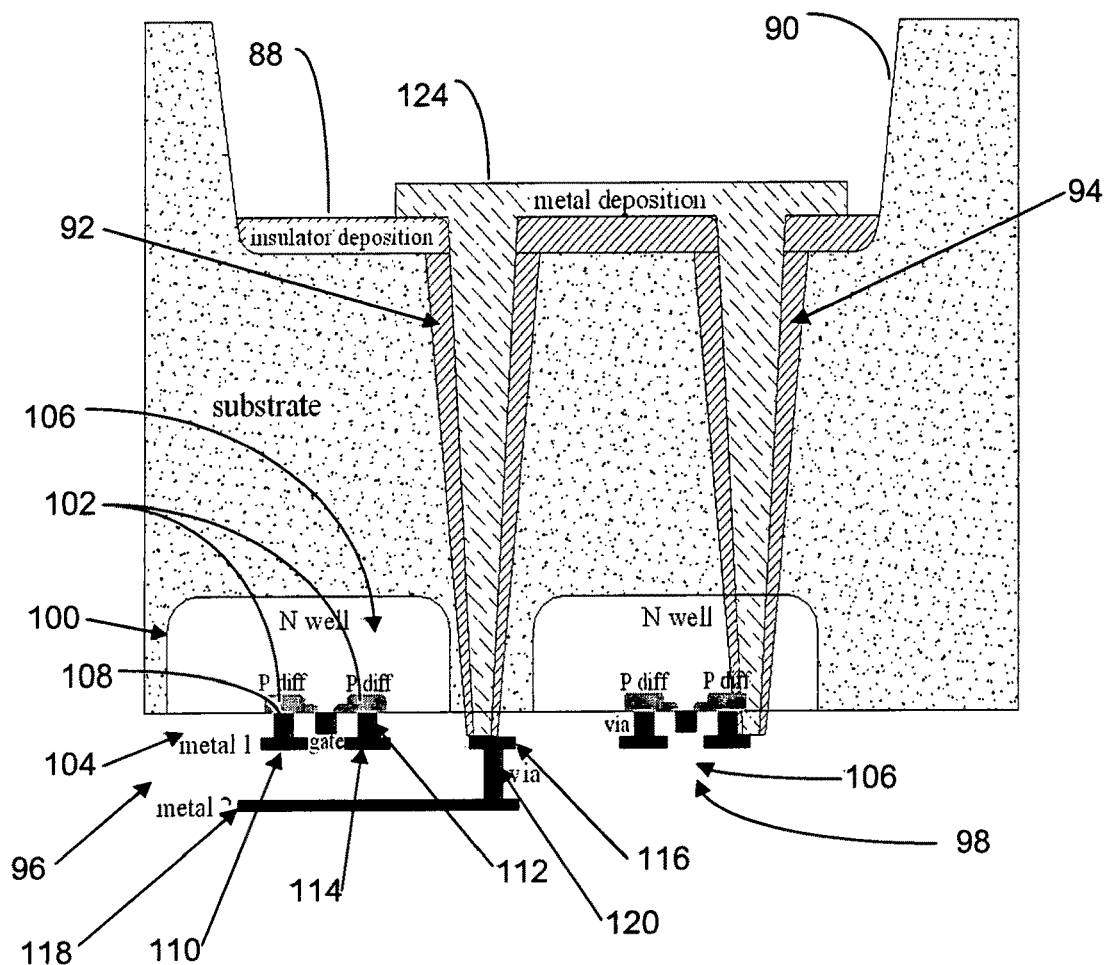
FIG. 12 is a representative section view of a semiconductor integrated circuit processed in accordance with various aspects of the present invention.

FIG. 12 is a representative section view of a circuit edit procedure performed from the floor 88 of a trench 90 milled in accordance with interference fringe techniques of the present invention. From the floor of the main trench 90, the user has milled two additional trenches (92, 94) to a depth below the n-wells of various underlying circuit structures. Through the voltage contrasting techniques described above or other methods and as illustrated in FIG. 9, the FIB user is able to clearly see the boundaries between the n-wells and the surrounding substrates. In this example, a left transistor configuration 96 and a right transistor configuration 98 are shown. The left transistor configuration comprises an n-well 100 with two p-diffusion regions 102. A drain 104 is formed at one p-diffusion and the source 106 is formed at the other p-diffusion. A first via 108 forms a contact between the drain and a metal 1 trace 110, and a second via 112 forms a contact between the source and a metal 1 trace 114. An additional metal 1 trace 116 is connected to metal 2 118 at a third via 120. The right transistor configuration includes a similar configuration with n-well and two p-diffusion regions, gate, drain and source, and vias forming connection to metal 1.

Precise positioning of the focused ion beam through generation of a voltage contrast image or through other imaging or FIB placement methods, facilitates the precise hole 92 milled through the trench floor to the metal 1 trace adjacent the left transistor. Further, a second precise hole 94 is drilled to the source contact of the right transistor. The relatively smaller dimension holes (trenches (92, 94) may be milled in accordance with endpointing techniques set forth herein. Insulator 122 is deposited along the trench floor and each precisely milled hole. To form an electrical contact, conductor 124 is deposited between the right hole and the left hole, over the deposited insulator. The deposition of the conductor creates a contact between the right and left transistors that did not exist before. In this way a user may test a circuit correction without refabricating the entire IC.

Figure 13A:
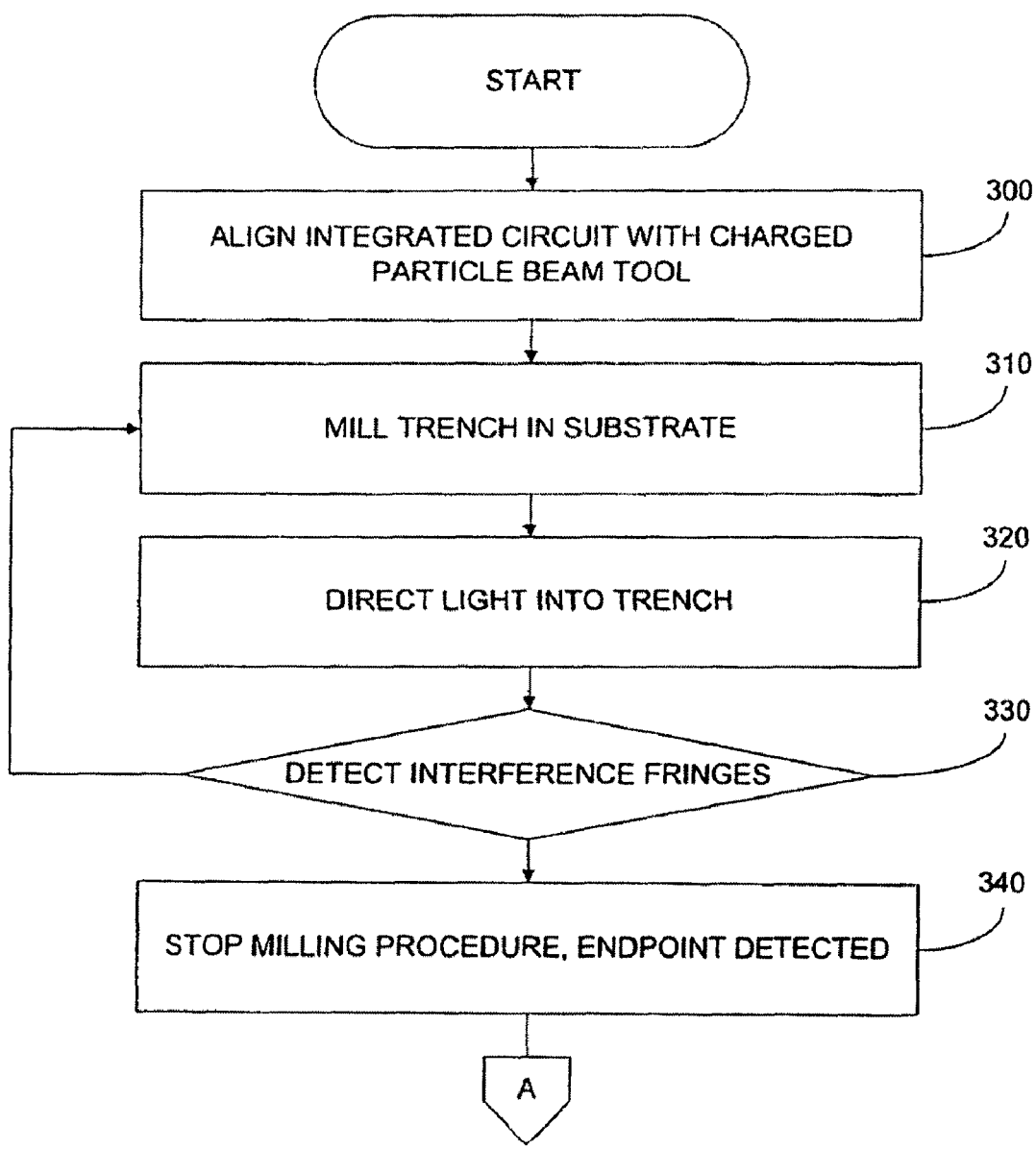
FIGS. 13A and 13B are a flowchart illustrating a method for charged particle beam endpointing through generation and detection of optical interference fringes and trench processing for enhanced imaging, in accordance with aspects of the present invention.
Figure 13B:
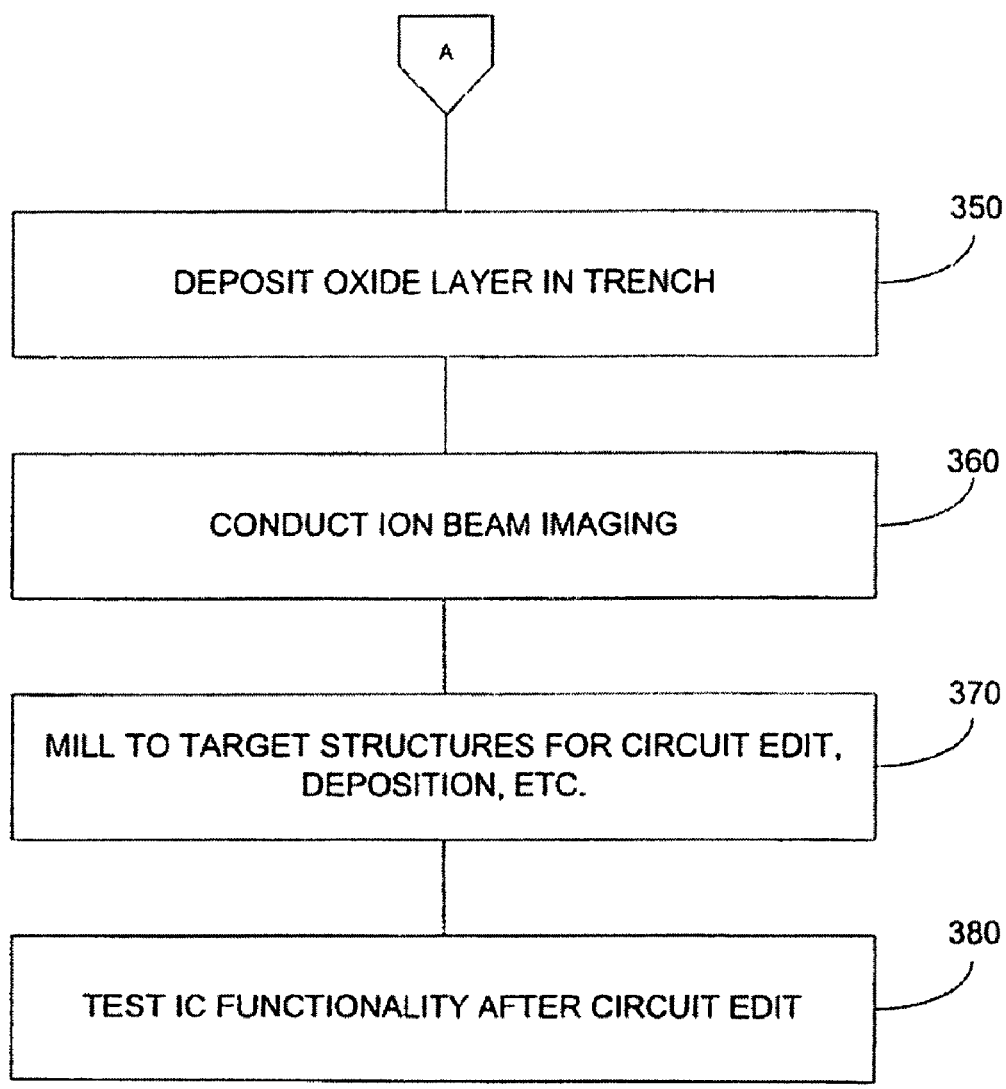

FIGS. 13A and 13B illustrate a flowchart of various operations that may be performed in accordance with aspects of the present invention. Referring first to FIG. 13A, in any milling or charged particle beam operation, it is appropriate to first align the target integrated circuit with the charged particle beam tool (operation 300). In many cases this involves an understanding of the location of a target underlying circuit configuration with respect to the outer boundaries of the IC package. Such alignment may be performed through imaging, computer-aided-design information about the IC, and other methods. The focused ion beam is precisely aligned with the desired incident location of the IC and the milling is begun (operation 310). In one particular example, FIB milling occurs at 30 keV with a beam current density of 10 pA/µm² in the presence of XeF₂. As mentioned above, during the milling operation light is directed into the trench (operation 320). The light is directed at particular target wavelengths, such as 500 nanometer wavelength with a 70 nm bandwidth filter, depending on the silicon doping concentration. For silicon with high doping concentration, a filter with a bandwidth of less than 70 nm may be appropriate for better fringe contrast. The milling operation is continued until the detection of interference fringes (operation 330). Upon the detection of interference fringes, the milling procedure is stopped as the endpoint has been detected (operation 340). For trenches greater than 50 µm×50 µm, FIB milling at 15 keV 24 4 nA/µm² in the presence of XeF₂ may be preferred. As mentioned above, at various intensities of interference fringes, the user may decide to stop the milling operation. As such, milling may continue after the first detection of interference fringes as the depth of the trench may not yet be appropriate. Such a case is when it is desired to perform voltage contrast imaging, which is best done when the trench is deep enough that it has begun to impinge on the underlying n-wells (i.e. within the p-n junction).

Referring now to FIG. 13B, before a voltage contrast imaging operation, oxide is deposited in a thin layer on the floor of the trench (operation 350). Then, ion beam imaging is conducted (operation 360). One method for ion beam imaging and secondary electron detection and imaging is discussed in co-pending application Ser. No. 10/887,800 titled "Charged Particle Guide" filed on Jul. 9, 2004, which is hereby incorporated by reference herein. After ion beam imaging is performed the user may direct the focused ion beam to perform precise holes in the trench floor down to exact target circuit structures (operation 370). The depth of the secondary trenches (precise holes) may be controlled using techniques set forth herein. The milling may be done for purposes of cutting metal layers, and/or depositing conductors so as to create connections that previously were not present. After the circuit editing is performed, the IC is tested for functionality using any appropriate automatic testing equipment (operation 380).

Interference fringe techniques may also be employed to define or even (e.g., flatten) trench floors and to define unique surface patterns in a semiconductor substrate. As discussed above, interference fringes are a function of the thickness of the semiconductor substrate. For example, in a trench, interference fringes are generated through the constructive and destructive interference between light reflecting from the trench floor and light propagating through the trench floor and reflecting back from active circuit layers under the floor.

Bands of interference fringes, such as shown in FIG. 5, indicate variations in trench floor thickness and/or trench floor surface topography. More particularly, the appearance of interference fringe bands is a function of the wavelength of the light used to generate the fringes. As discussed above, in the image of FIG. 5, the fringes 48 are identified by the darker areas. There are fringes present for each wavelength period of separation between the surface and the underlying surface. As such, the pattern, separation, and number of fringes reflects the spatial relationship between the trench floor surface and the underlying features. In the example of forming a trench and using 500 nm wavelength light, there is a fringe present for any difference of 500 nm between the trench floor and the underlying structure. Thus, for example, if one fringe represents 5000 nm separation between the trench floor and the underlying structure, then an adjacent fringe either represents 4500 nm or 5500 nm separation.

Still with regard to FIG. 5, the relatively large spot of even coloring at the center middle of the image shows a relatively even trench floor thickness. The fringes throughout the remaining FIG. 5 image, however, illustrate the unevenness of the trench floor in 500 nm trench floor gradients, and also illustrates the unevenness in trench floor thickness. The active circuit layers are relatively consistent; thus, fringe patterns are primarily a function of trench floor unevenness.

Figure 14:
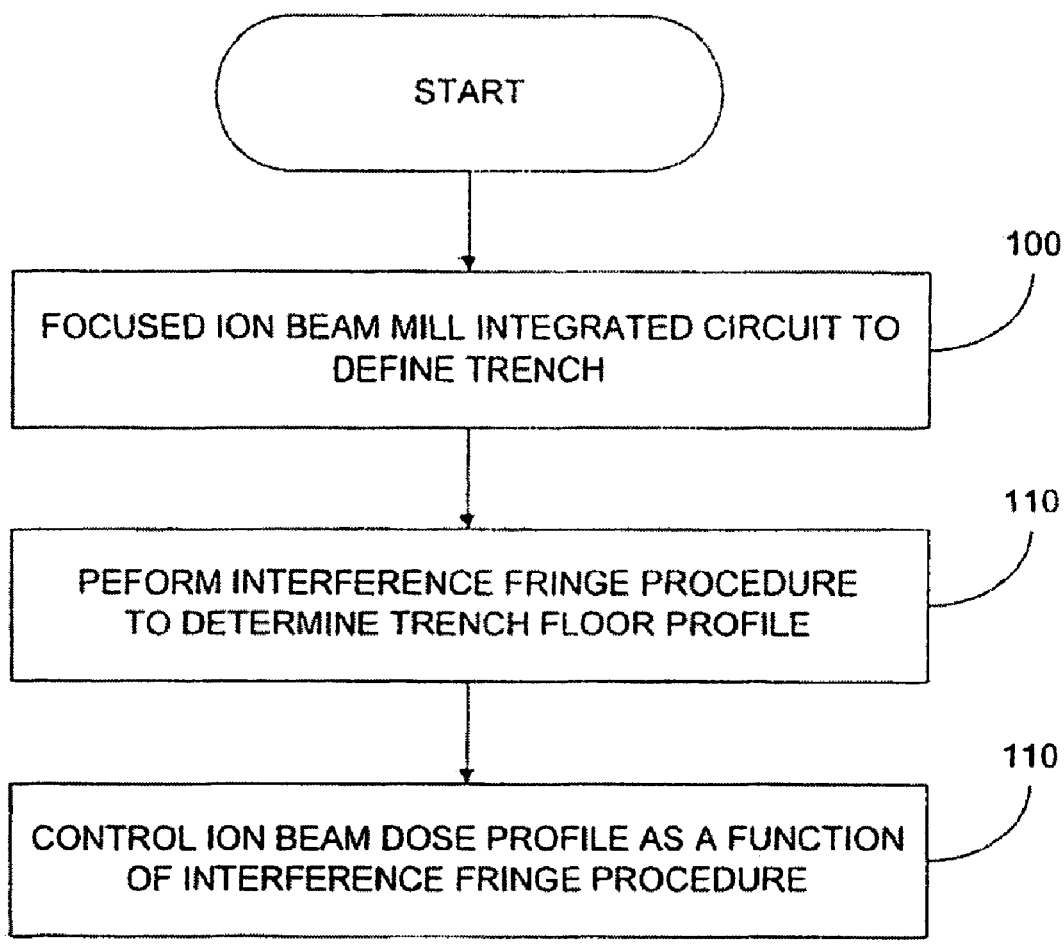
FIG. 14 is a flowchart illustrating a method conforming to aspects of the present invention.

Referring to FIG. 14, in accordance with one method conforming to aspects of the present invention, analysis of the fringe patterns may be employed to control further milling operations to define a trench floor with a substantially even and/or flat floor profile. As is discussed in further detail below, analysis of the fringe patterns may be employed to control further milling operations to define other surface patterns in a semiconductor substrate as well. First, a focused ion beam is employed to mill an Integrated circuit to define a trench. The method set forth in FIG. 14 is described with reference to the use of a focused ion beam to mill a trench. However, trench milling may be performed in accordance with other milling techniques, such as those involving mechanical milling, lapping, laser etching, chemical etching, polishing, and charged particle beams.

Figure 15:
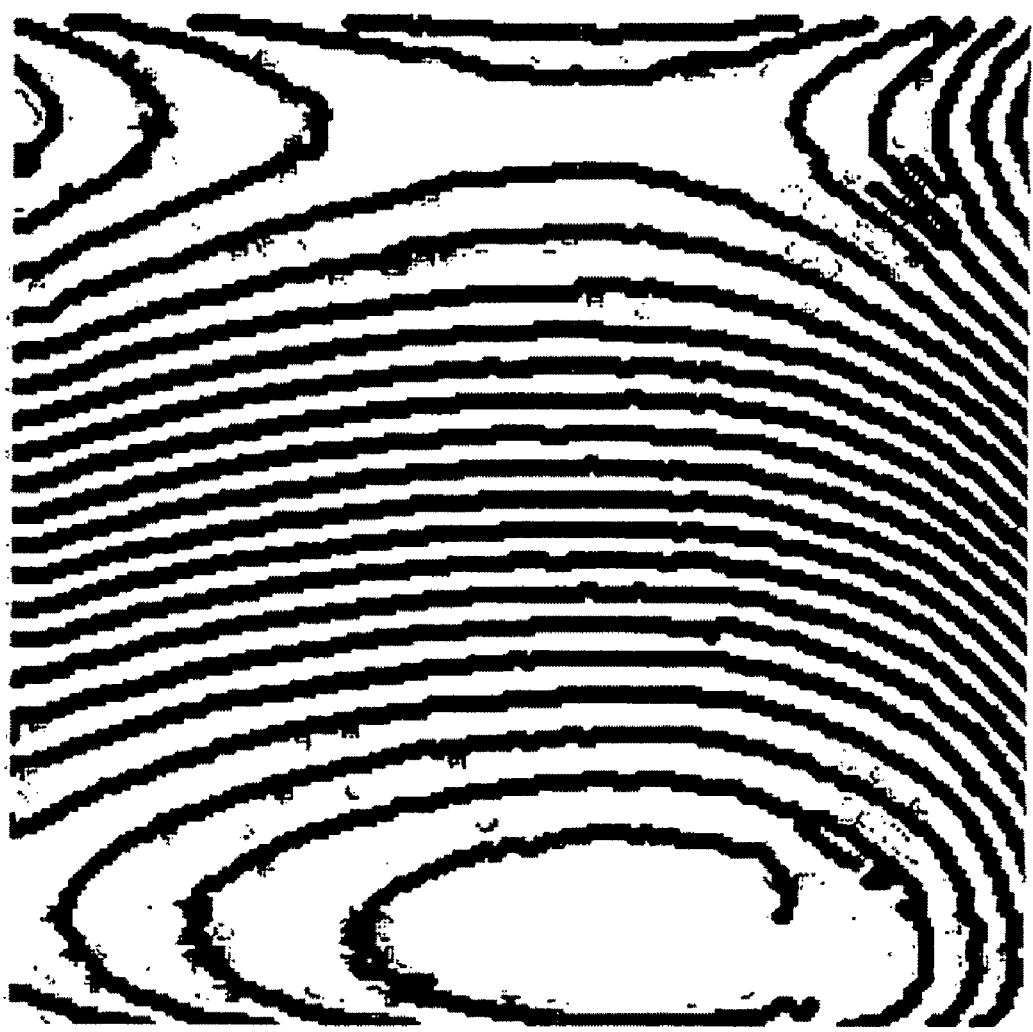
FIG. 15 is a representative image of enhanced the interference fringes of FIG. 5 generated and detected for charged particle beam processing, in accordance with aspects of the present invention.

At some point in the milling process, light is propagated to the trench floor and the resulting fringes, if any, are analyzed. In one particular implementation, the fringe pattern may be further processed to enhance fringe contrast, as shown in FIG. 15. Image enhancement may involve various techniques to enhance the detection of fringes, including, but not limited to, subtraction of noise, increasing contrast, and averaging. Enhancement of fringe contrast, amongst other advantages, can aid in fringe recognition. Fringe recognition is especially important when initially detected fringes, such as with relatively thicker trench floors, are faint. In some instances, as discussed above, depending on the frequency of the light and the thickness of the trench floor, no fringes will be detected.

When the fringes are detected, the pattern, separation, and/or width of the fringes may be employed to generate a gradient and/or thickness profile for the trench floor.

In a first implementation, trench floor thickness and/or profile variations may be corrected by successively rotating the integrated circuit some degree, such as 90 degrees, and milling the trench floor at each rotational position. This technique may be employed in conjunction with interference fringe detection. However, it is possible that rotating the sample might be sufficient, without additional fringe analysis based milling control (discussed below), to create a floor profile of sufficient uniformity for some applications. Further, this technique may be employed early in the milling process and/or throughout the milling process to help ensure as even a trench floor as possible. Interference fringe techniques may then be employed throughout the milling process or at discrete times during the milling process to determine whether the milling process is creating a relatively even trench floor and whether additional trenching adjustments and control are needed.

Figure 16:
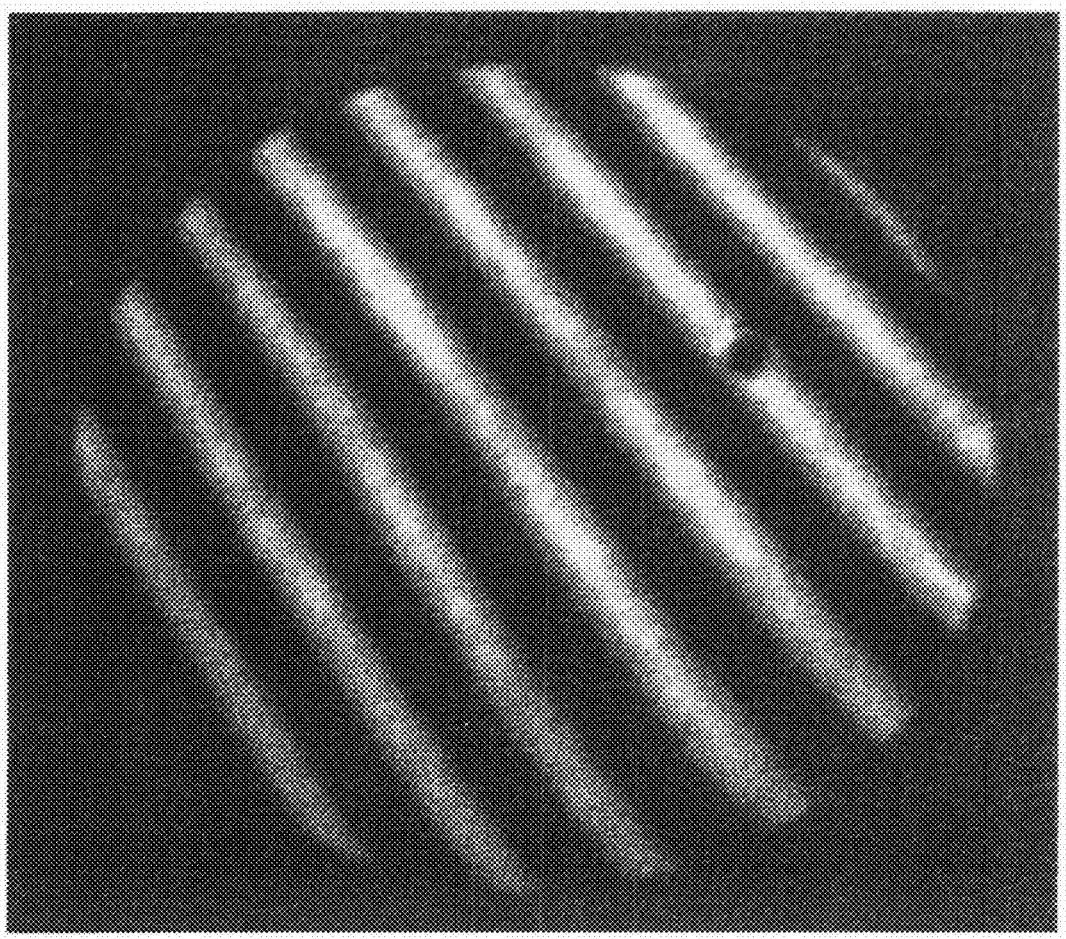
FIG. 16 is a second representative image of interference fringes of a relatively flat and sloped trench floor generated and detected for charged particle beam processing, in accordance with aspects of the present invention.

In some focused ion beam systems, chemistry injection occurs to one side of the trench floor. In such an arrangement, it is possible to have differing chemistry concentrations at different locations of the trench resulting in varying milling rates for a given dwell time of the focused ion beam. As such, trench floor variations may occur. FIG. 15 illustrates one example of the interference fringe pattern for a non-uniform trench floor profile. FIG. 16 illustrates a second example of interference fringes for a non-uniform trench floor profile. In the example of FIG. 16, the interference fringes are relatively linear and relatively evenly separated. The pattern of FIG. 16 is consistent with a relatively flat, but sloped, trench floor. The trench floor pattern of FIG. 16 is also consistent with a focused ion beam milling operation with a single chemistry injection port with only one orientation relative to the trench. In such a focused ion beam milling system, trench floor thickness may initially be controlled through rotation of the sample or rotation of the chemistry port so that chemistry injection differences are evenly distributed across the trench resulting in a more even trench floor profile.

Another possible implementation may involve a plurality of chemistry injection ports arranged at different angles with respect to a beam. As such, chemistry may be introduced in the trench more evenly than from a single injection location. A plurality of chemistry injection ports may be used in conjunction with sample rotation.

In addition to sample rotation and/or a plurality of chemistry injection ports, or separate therefrom, implementations may also involve techniques for determining trench floor thickness. In one example, endpointing techniques discussed above may be employed with sample rotation. As the milling process proceeds, interference fringe detection also proceeds. When certain trench floor thicknesses are reached, the pattern may be analyzed. In the event there is fairly even floor such that the entire floor presents a single fringe, as milling proceeds the fringe will vary as constructive and destructive interference varies.

Figure 17:
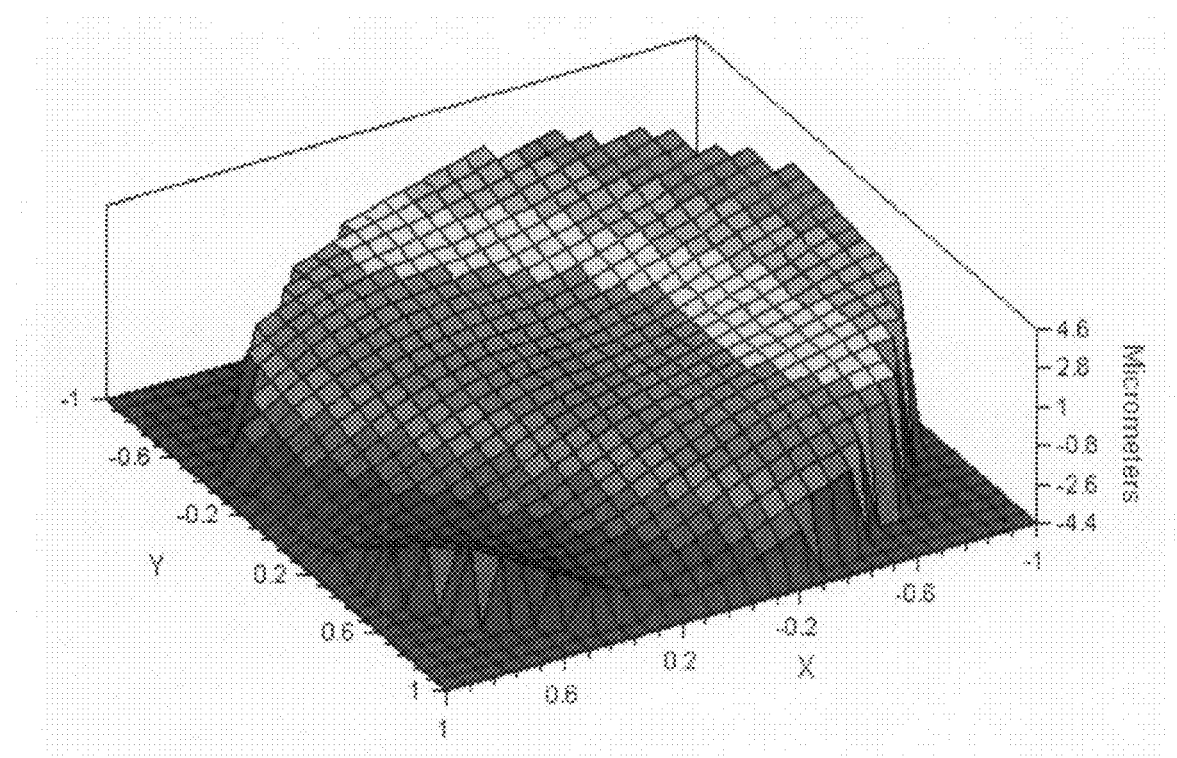
FIG. 17 is a three dimensional graphical representation of a trench floor thickness profile generated in accordance with aspects of the present invention.

In addition to sample rotation or separate therefrom, implementations may also involve techniques for determining trench floor thickness. FIG. 17 is a three dimensional plot of trench floor thickness profile. In one particular implementation, the trench floor profile may be generated through a technique involving analysis of the phase shift between fringes generated from two different wavelengths. The relative height difference between any two fringes is a direct function of the wavelength. Thus, as discussed above, for 500 nm white light, each adjacent fringe is either 500 nm higher or 500 nm lower than the adjacent fringe.

In one implementation, determination of the thickness of the trench floor involves the application of two different wavelength light sources in the trench or any other surface being processed, one light source having wavelength $\lambda_1$ and the second light source having $\lambda_2$. The maximum theoretical floor thickness ($T_{max}$) that may be measured is provided by formula 1, where n is the refractive index for the measured material (e.g., Silicon n=3.5):

$$T_{MAX} = \frac{2 \cdot \lambda_1 \cdot \lambda_2}{n(\lambda_1 - \lambda_2)}$$

$$T = Const \cdot (\lambda_1 - \lambda_2) \cdot \Delta\phi$$

The thickness of the floor or other feature is given by formula 2, where Const=f (spectrum of light*filter curve*responsivity of detector) and $\Delta\phi$ is the phase difference between $\lambda_1$ and $\lambda_2$ measured in degrees:

The predicted measurement accuracy using formula 2 for a relatively thin wafer roughly ±50 nm. From formula 2, a thickness profile, such as is shown in FIG. 17 may be developed.

From the thickness profile, implementations of the present invention may then control the milling process as a function of the profile. With respect to a focused ion beam system, implementations of the present invention may control the focused ion beam milling procedure as a function of the thickness profile. As introduced above, in focused ion beam based milling, the ion etch rate is a function of the ion dose injected into the sample processing area (number of ions in unit area). Higher ion dosages (or e.g. gallium ion concentration) are accompanied by corresponding higher etch rates. When the trench thickness is not uniform, one way to get a flat surface is to etch the relatively thicker areas with relatively higher ion dose than the relatively thinner areas.

As discussed above, the ion beam is scanned, typically in a rectangular pattern, with the beam being positioned at discrete locations, or pixels, for discrete periods of time, referred to as the dwell time, before moving to the next location. The etch rate for a given pixel location may be increased or decreased by either relatively increasing or decreasing the dwell time at a given location, which correspondingly increases the ion dose in a given area causing an increased etch rate. It is also possible, in some instances, to increase the ion dose through an adjustment of the chemistry injection at a given time, either independently or in conjunction with increasing or decreasing dwell time. Further, it is also possible to increase or decrease the beam energy either alone or in conjunction with other techniques at various points in the scan process to control the etch or milling rate as a function of a surface or thickness profile. Thus, in one implementation, a given thickness profile may be converted to an ion dose map that controls the ion dose levels at a given pixel location. The ion dose map is mathematically a 2D array with each pixel as ion beam dwell time. The ion dose map is then imported to a scan generator that commands a FIB scan board to drive the FIB.

Besides deployment for endpointing and trench floor profile flatness definition, fringes may also be employed to control a milling process to construct specific shapes in the surface of a material. In one particular implementation, it is possible to define a lens in the surface of a substrate. Orientation of the lens above a particular feature of interest within an IC may be employed for focusing an ion beam, light beam, laser beam, or other type of beam on the particular feature of interest. Such an ability to accurately focus various beam types is particularly useful as integrated circuit device geometries continue to shrink below the wavelength of particular beam types. In such instances, some beam types will cover adjacent structures when it is directed on a particular target. Thus, integrating a lens in the IC allows a beam to be focused on a particular target structure without significantly overlapping adjacent structures.

Defining a particular surface profile, as opposed to flattening the surface, is similar in procedure to that employed for trench floor flattening. The surface profile may be defined in a trench, either on the front or backside, or may be formed directly on the front or backside of an integrated circuit. To define a particular shape, in a focused ion beam implementation, the ion dose profile is carefully controlled to define a particular shape. The actual milling performance is monitored through interference fringe detection to determine the performance of the ion dose profile control, and also to make adjustments in the ion dose profile.

Figure 18A:
FIG. 18A is a representative section view of a convex shape milled in a semiconductor substrate in accordance with aspects of the present invention.
Figure 18B:
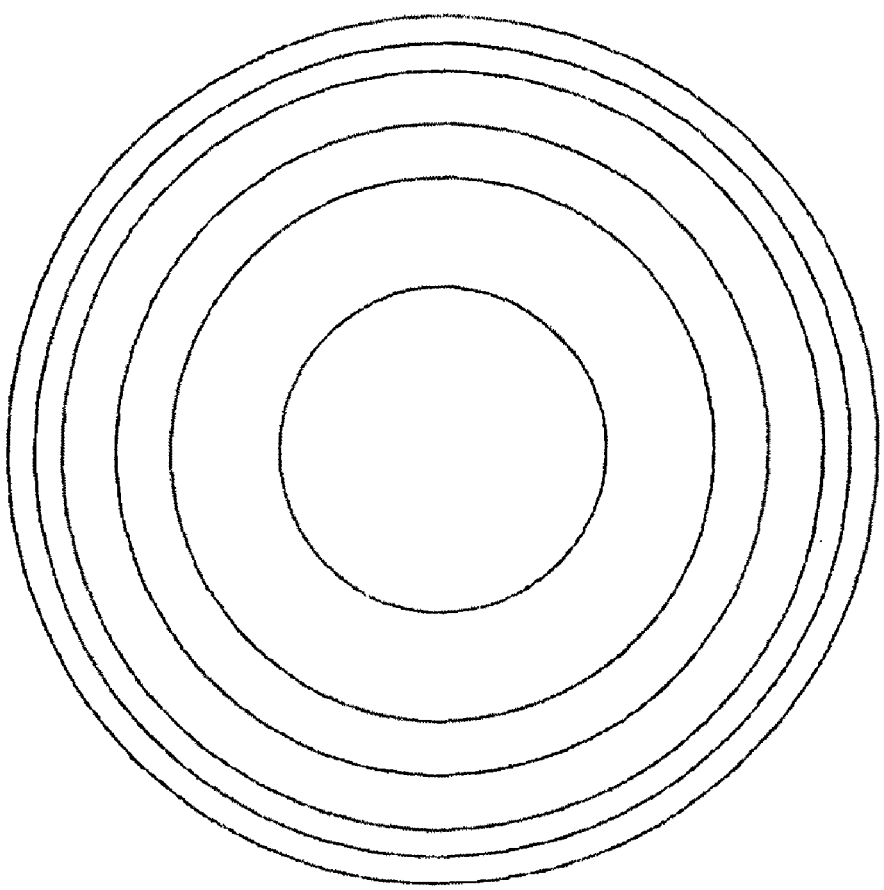
FIG. 18B is a representative fringe pattern for the convex shape of FIG. 18A, the fringe pattern generated from a single wavelength of light, in accordance with aspects of the present invention.
Figure 19A:
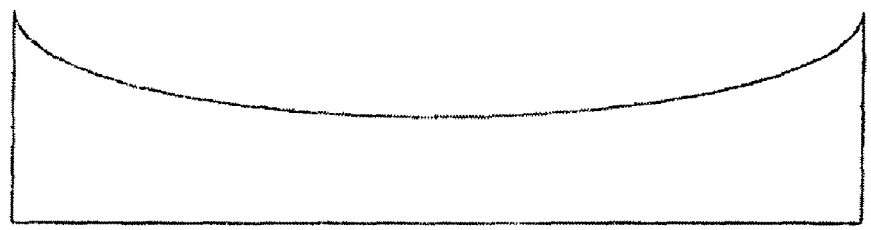
FIG. 19A is a second representative section view of a convex shape milled in a semiconductor substrate in accordance with aspects of the present invention.
Figure 19B:
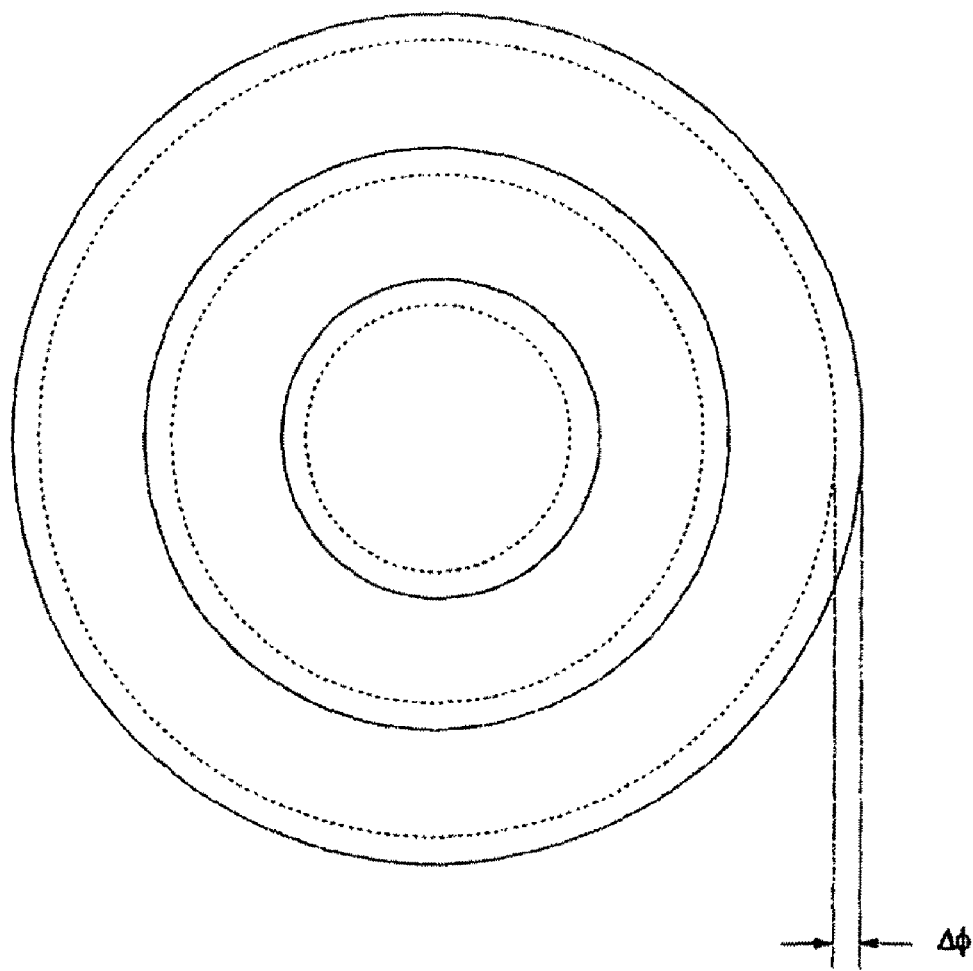
FIG. 19B is a representative fringe pattern for the convex shape of FIG. 19A, the fringe pattern generated from a first and second wavelength of light, with the phase shift between the first and second wavelengths represented by $\Delta\phi$, in accordance with aspects of the present invention.

FIG. 18A is a section view of a convex surface defined in the backside substrate of an integrated circuit. FIG. 18B is a representative fringe image of the same surface. In the example set forth in FIGS. 18A and 18B, the fringe image is generated with a single wavelength of light, and the relative difference between the fringes is compared to obtain the surface profile of the structure being defined. FIG. 19A is a section view of a second convex surface defined in the backside substrate of an integrated circuit. FIG. 19B is a representative fringe image of the same surface. In the example set forth in FIGS. 19A and 19B, the fringe image is generated with two different light wavelengths. Thus, from the fringe data of FIG. 19B, it is possible to determine both the surface profile and the thickness of the substrate.

EXAMPLE

Figure 20:
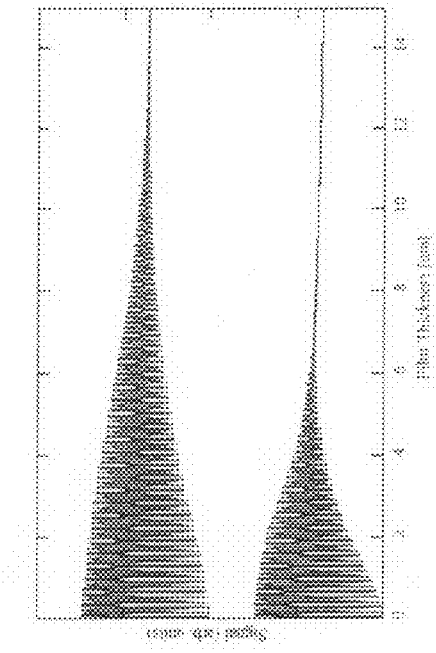
FIG. 20 illustrates trench and edit holes prepared for circuit edit performed without the use of the present invention.

FIG. 20 illustrates trench and edit holes prepared for circuit edit performed without the use of the present invention. The example of FIG. 20 illustrates the importance of planar and flat trench preparation for circuit edit. As illustrated, the floor 2005 of the trench is at an oblique orientation with respect to the planarity of the substrate. Consequently, the aspect ratio of contact hole 2015 differs from that of 2020. This leads to inaccurate and unreliable endpointing. As is also illustrated, part of the N-well became exposed, which may interfere with the circuit edit or the performance of the IC. The use of the method and apparatus of the invention helps avoid such problems and ensures that the trench floor is planar and parallel to the orientation of the substrate. Of course, as explained above, when shapes other than planar trench floor are required, the methods and apparatus described herein may be used to achieve the desired shape.

In this example, thinning of the sample was performed in two stages: global thinning and local trenching. Global thinning may be performed at, for example, an initial beam current of 20 nA and beam energy of 30 keV. However, once fringes contrast increases, in this example the beam current and energy are dropped to 4 nA and 15 keV, respectively. During the global thinning, the thickness of the remaining silicon was determined based upon the amplitude of the interference fringes as a function of time. During the trenching stage the thickness of the remaining silicon was determined using dual-wavelength illumination and observing the phase shift between the fringes of the two wavelengths. To calculate the topography of the remaining silicon in the trench floor, a sequence of frames was recorded by a CCD camera, using low coherence illumination. The illumination was obtained using Xe lamp and an optical filter centered at 950 nm and having bandwidth of less than 10 nm.

The fringe formation for a single wavelength in the recorded frames were analyzed as follows. First, a model was considered having an exposed silicon layer having a complex refractive index n2 and thickness d, which needs to be calculated. The silicon layer is on top of a supporting layer (e.g., inter-layer dielectric) having refractive index n3. The incident beam Ei and reflecting beam Er have wavelength λ, travel through fluid (gas composition) of refractive index n1 and are perpendicular to the silicon layer. The complex amplitude of reflected radiation $E_r$ is related to complex amplitude of incident radiation $E_i$ by amplitude reflection coefficient R:

$$E_r = R \cdot E_i \quad \text{Eq. 1}$$

For simple single thin layer the amplitude reflection coefficient R is given by:

$$R = \frac{r_{1,2} + r_{2,3} e^{-j2\beta}}{1 + r_{1,2} r_{2,3} e^{-j2\beta}} \quad \text{Eq. 2}$$

where β is a term describing propagation inside thin layer, $r_{1,2}$ and $r_{2,3}$ are complex Fresnel coefficients describing reflection from ambient—Si interface and reflection from backside silicon-pattern interface.

The Fresnel coefficients are related to complex refractive indices of ambient, thin silicon layer and support material (which we assume for time being to be homogenous) by following Equations:

$$r_{1,2} = \frac{n_1 - n_2}{n_1 + n_2} \quad \text{Eq. 3}$$

$$r_{2,3} = \frac{n_2 - n_3}{n_2 + n_3} \quad \text{Eq. 4}$$

$$\beta = 2 \cdot \pi \cdot n_2 \cdot \frac{d}{\lambda} \quad \text{Eq. 5}$$

where $n_1$, $n_2$, $n_3$ are complex and generally wavelength dependent refractive indices of ambient, silicon, and support material respectively, d is thickness of measured thin layer (in this example crystalline silicon), and λ is wavelength of impinging radiation.

From Eq. Eq. 2, Eq. , Eq. , and Eq. we see that amplitude reflection coefficient depends both on wavelength and layer thickness R=R(d,λ). From Eq. , we see that reflectance of the sample is simply equal to $$R_I(d,\lambda) = |R(d,\lambda)|^2 \quad \text{Eq. 6}$$

In this example the sample is probed using quasi-monochromatic light having a finite spectrum W(λ) characterized by central wavelength $\lambda_c$ and spectral bandwidth Δλ. In the system used for this example, $\lambda_c$ and Δλ are defined by optical filters, light source emission spectrum, responsivity of the detector D, and optical transmission of other optical components. To simplify discussion, the response function of entire measurement system (except measured sample) is described by W(λ). In this example, $\lambda_c$=850-1000 nm while Δλ<10 nm. The signal detected by averaging detector (in this case CCD) is therefore given by simple integral:

$$\text{Signal}(d) = \int |R(d,\lambda)|^2 \cdot W(\lambda) \cdot d\lambda \quad \text{Eq. 7}$$

Since Δλ is small we can neglect dispersion of $n_1$, $n_2$, $n_3$ and assume in good approximation that all wavelengths dependence of signal within Δλ is due to oscillatory term $e^{-j2\beta}$ in Eq. 2.

Figure 21:
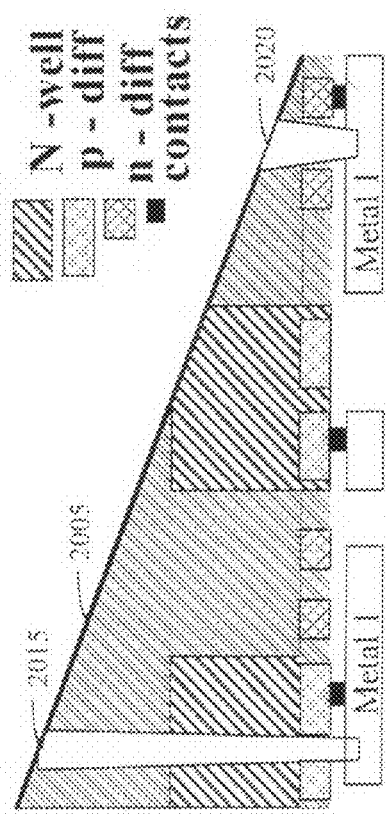
Figure 22:
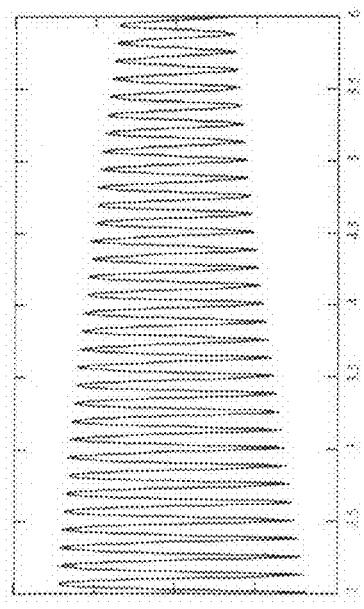
FIG. 22 illustrates an expanded section of the simulation illustrated in FIG. 21.

FIG. 21 illustrates the results of the simulation for bare silicon slab, while FIG. 22 illustrates an expanded section of the simulation illustrated in FIG. 21. The following parameters were used for purpose of simulation: λ=900 nm, Δλ=7.1 nm (upper trace), and 14 nm (lower trace), $n_1$=1, $n_2$=3.60−i0.0037, $n_3$=1. It is assumed that the spectrum is perfect Gaussian given by $W(\lambda) = \text{const} \cdot \exp(-(\lambda-\lambda_c)^2 / 2(\Delta\lambda/2)^2)$. The observed signal reveals strong Fabry-Perot oscillations when the wafer thickness becomes comparable or smaller than the bandwidth determined coherence length of probing radiation. When the film thickness becomes very small, the amplitude of the oscillations saturates. Observed traces reveal series of fringes spaced by distance corresponding to half of the wavelength of radiation propagating in optically dense film. In this example, the fringes are separated by approximately 125 nm as shown in FIG. 22.

The observed Fabry-Perot fringes are not perfectly sinusoidal, and the deviation from perfect sine shape becomes more pronounced when the film becomes thin, and in principle these oscillations can be more exactly modeled using Airy functions. The measured signal depends on Fresnel coefficient $r_{2,3}$ which depends on optical properties of the backside of support material of the sample.

Figure 23:
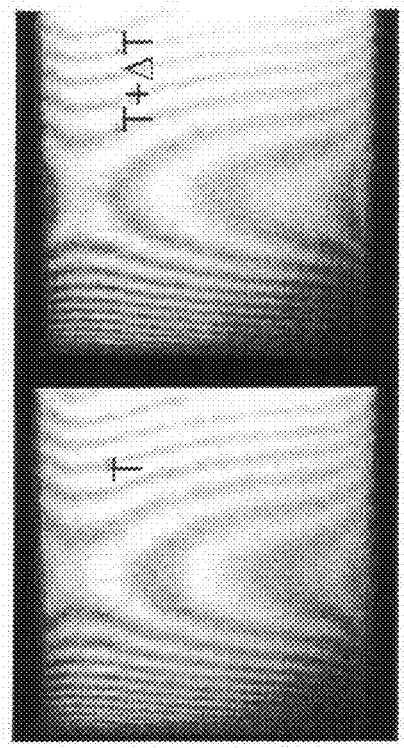
FIG. 23 shows two consecutive frames collected at time T (left panel) and time T+$\Delta$T, revealing Fabry Perot interference patterns.

In the system used for this example, an array detector is used to measure the reflected light's intensity as a function of position on the sample. The collected images are used to study position dependent thickness, and thickness variation of the sample d=d(x,y) (where (x,y) are sample coordinates in plane perpendicular to impinging radiation). In practice the array detector is collecting series of signal images m=1, 2, . . . , M at approximately equal time intervals, where m is numerating frames in the chronological order. Example of two frames from such measurement is presented in FIG. 23. During the etching process, the observed interference pattern is evolving. The Fabry—Perot interference fringes are evolving and shifted in phase with respect one to another.

If the fringes can be approximated by cosine function as discussed above, and rate of etching ε(x,y) is small $$\left( \frac{\varepsilon(x,y) \cdot \Delta T \cdot m}{d(x,y)} \ll 1 \right),$$

and when the set of frames is small, then Signal(x,y,T+m·ΔT) can be expressed by following equation:

$$\text{Signal}(x,y,m) = A(x,y) + B(x,y)\cos(\phi(x,y) + \Delta\phi(x,y) \cdot m)) \quad \text{Eq. 8}$$

where:

$$\varphi(x,y) = 2 \cdot \pi \cdot \text{Re}(n_2) \cdot \frac{1}{\lambda} \cdot d(x,y),$$

m=1 . . . M, A(x,y), B(x,y) are slowly varying functions of d and can be assumed constant for and $$\Delta\varphi(x,y) = 2 \cdot \pi \cdot \text{Re}(n_2) \cdot \frac{1}{\lambda} \cdot \varepsilon(x,y)$$

does not depend on m.

The equation m describes formally a set of phase-shifted images, where phase shift between two consecutive frames is position dependent function Δφ(x,y). The differences between this data and PSI (phase shifting optical interferometers) generated interferograms are, among others: (i) x, y dependence of Δφ(x,y), and (ii) the fact that Δφ(x,y) has preset value by etch rate ε(x,y). In general Δφ(x,y) cannot by easily adjusted by metrology to some convenient value as required by commonly used 3, 4, or 5 steps PSI algorithms. PSI stepping algorithms determine measured "wrapped" phase $\phi_{PSI}(x,y)$, which values are restricted to interval $(-\pi,\pi]$ with accuracy to additive constant:

$$\phi(x,y)=\phi_{PSI}(x,y)+s(x,y)\cdot 2\pi \qquad \text{Eq. 9}$$

where $s(x,y)$ is integer function of (real) coordinates x, y.

Figure 24D:
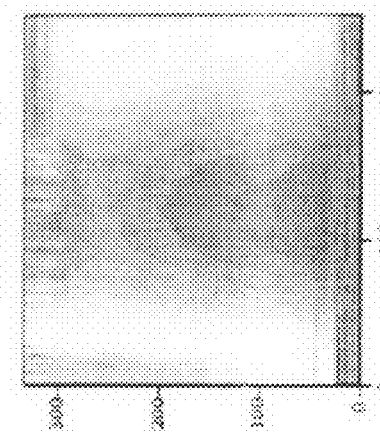
FIGS. 24A-E depict example of analysis of interferogram.
Figure 24E:
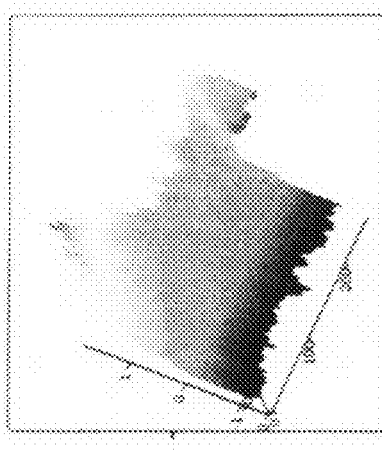
Figure 24B:
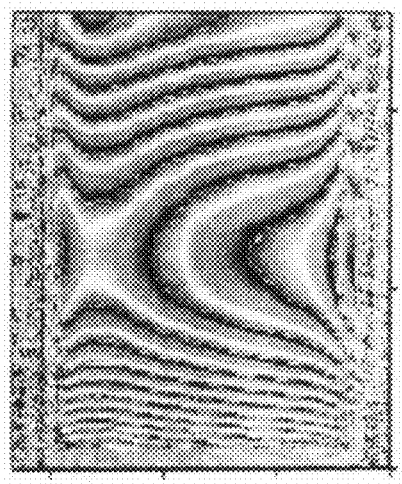

In order to calculate wrap, a wrapped phase recovery algorithm was developed, allowing to recover wrapped phase $\phi(x,y)$ with accuracy of about 5% and speed comparable to 2+1 step algorithm. Example of calculated wrapped phase map is shown in FIG. 24B.

Figure 24C:
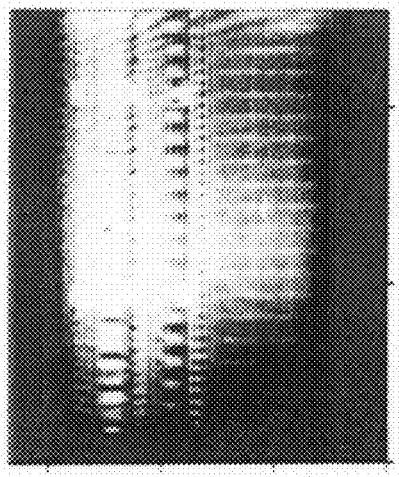
Figure 24A:
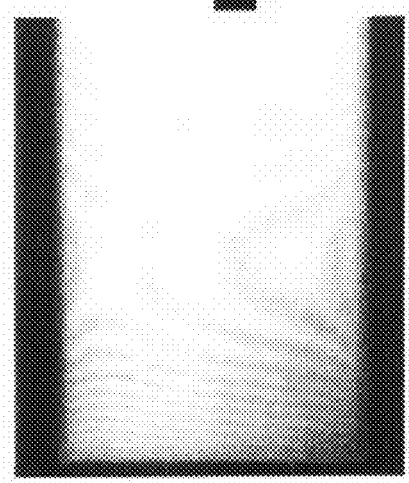

The amplitude of the observed oscillations $B(x,y)$ provides accurate information about the value of Fresnel coefficient $r_{2,3}$ describing pattern residing on the back-side of the silicon. The amplitude $B(x,y)$ can be also used for a quality map for phase unwrapping algorithms, and example of such quality map is presented in FIG. 24C. By quality guided unwrapping technique it is possible to "un-wrap" phase $\phi_{PSI}(x,y)$ and to find unique function $\phi_{unwrapped}(x,y)$ such that:

$$\phi(x,y)=\phi_{unwrapped}(x,y)+S\cdot 2\pi \qquad \text{Eq. 10}$$

where S is a single integer constant, and does not depend on spatial coordinates x, and y.

From Eq. and Eq. we see that by performing unwrapping we can determine thickness of the wafer up to constant additive multiple of 125 nm. This procedure is useful for determining thickness variation of measured layer, which is measure of uniformity of etching process. Example of recovered layer thickness variation is presented in FIGS. 24D and 24E.

Thickness measurement using a single wavelength (mainly for the global thinning process) was determined as follows. If the Fresnel coefficient $r_{2,3}$ (Eq.) is approximately real in limit ($\text{Re}(r_{2,3})>>\text{Im}(r_{2,3})$) and $r_{2,3}>0$ then the envelope of observed oscillation as function of silicon thickness d saturates in limit of small thickness and can be approximated by few terms of its series expansion:

$$A(d)=a+b\cdot d^2+\ldots \qquad \text{Eq. 11}$$

We get the following relationship by calculating derivatives of both sides of Eq. , and normalizing amplitude find that:

$$d = const\cdot \frac{1}{A}\frac{\Delta A}{\Delta d} \qquad \text{Eq. 12}$$

Normalization with respect to amplitude A helps to eliminate variation due to changes of optical alignment, and due to changes of value of $r_{2,3}$ across the sample. This process of wafer thickness analysis can be used for very rough estimate of the thin layer thickness. The incremental change of sample thickness $\Delta d$ in the denominator of Eq. can be determined with good accuracy by counting Fabry-Perot oscillations. The main source of error is amplitude of oscillation measurement. In this example it was shown that accuracy is about $\pm 2$ μm For better accuracy in determining the thickness a dual-wavelength technique was employed. This enables better control of the milling and a more accurate endpointing. The reflection coefficient depends only on the ratio of silicon film thickness and the probing wavelength.

$$R_f(d,\lambda)=R_f(d/\lambda) \qquad \text{Eq. 13}$$

From Eq. 13 it may be seen that fringes measured at two close, but different wavelengths $\lambda 1$ and $\lambda 2$ are shifted in phase with respect to each other. For sufficiently thin silicon, a shift between observed fringe patterns is proportional to the silicon thickness. By measuring phase changes between the two wavelengths, the silicon film thickness can be determined. The measurement accuracy using two wavelengths is a fraction of the wavelength, and is expected to be $\pm 50$ nm.

Figure 25:
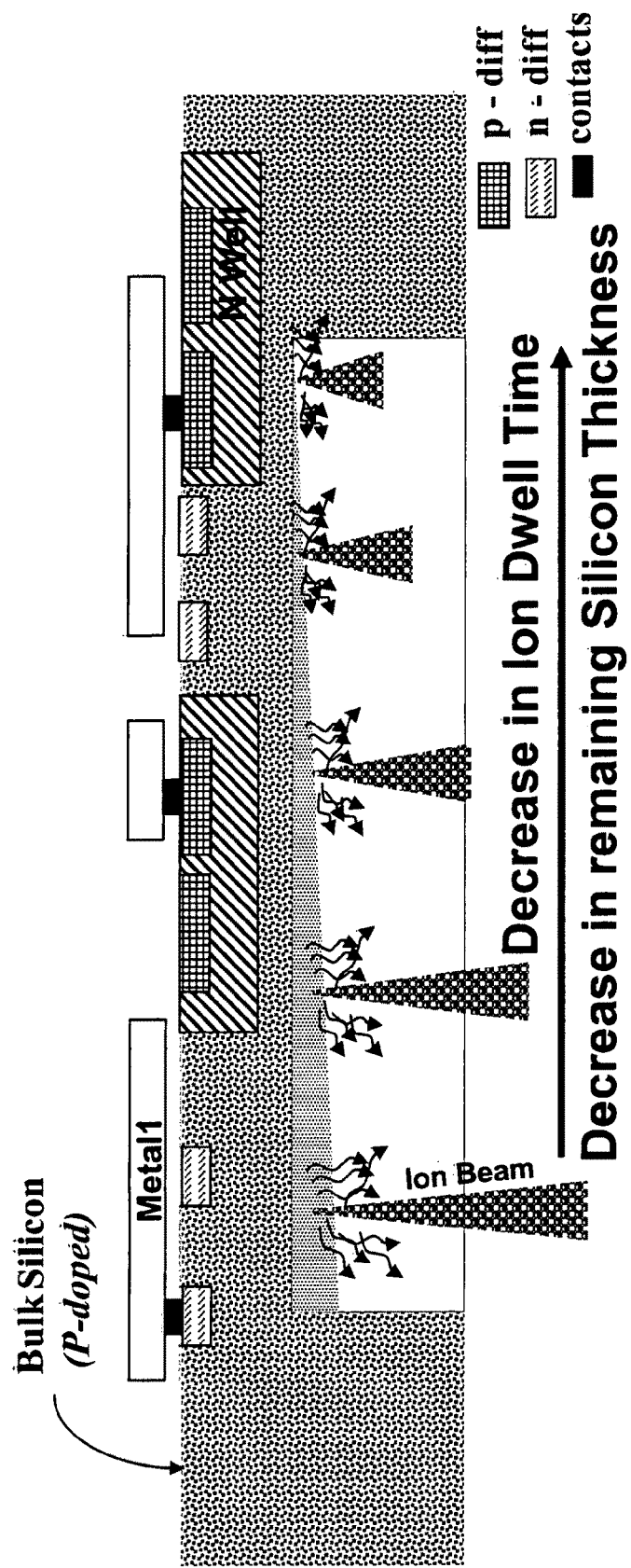
FIG. 25 illustrates a cross-section demonstrating control of beam parameters as a function of measured silicon thickness to control the shape of the etch front.

To summarize, in this example a flip chip IC was thinned while performing thickens measurements using a single wavelength, until the remaining thickness was 10 μm. Then the dual-wavelength thickness measurement was utilized to continue the thinning with an improved accuracy and provide accurate end point. The calculations and mappings obtained and shown in FIGS. 24B-E were continuously used to vary the milling characteristics (e.g., beam dwell time) at each location to control the flatness of the trench. This is schematically illustrated in FIG. 25, wherein the remaining silicon is shown thicker at the left side of the cross-section than in its right side. Therefore, the ion dwell time is decreased as the beam is moved to the right. Of course, other parameters may be controlled, such as beam current, beam energy, etc.

Figure 26:
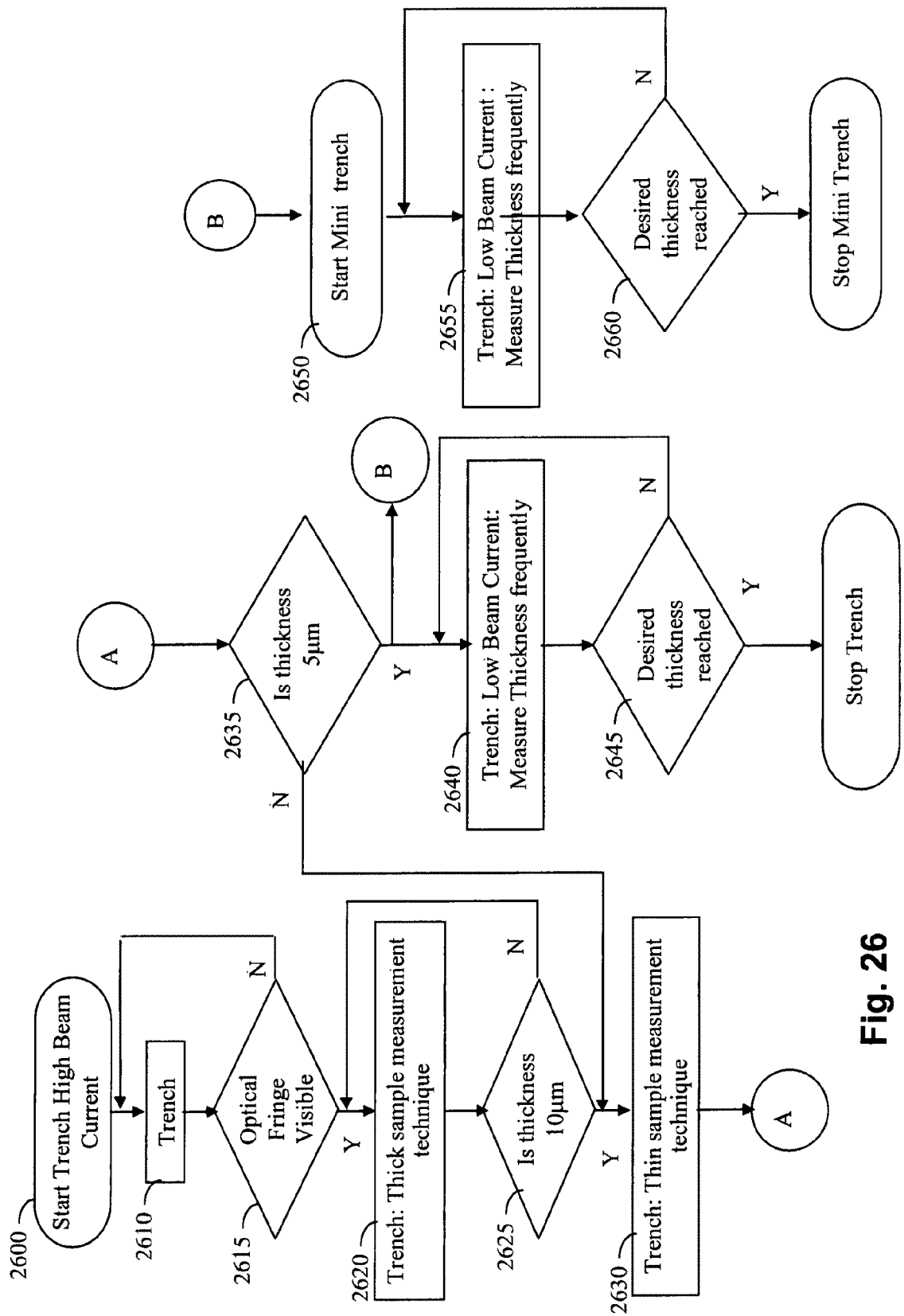
FIG. 26 is a flow chart illustrating a flow process according to an embodiment of the invention.

FIG. 26 is a flow chart illustrating a flow process according to an embodiment of the invention. The process starts at 2600 where the FIB is set to a high beam current, e.g., 20 nA at 30 keV beam energy, for trenching process 2610 to trench a 300×300 μm trench. An optical image is obtained and is examined for optical fringes at 2615. If no fringes are visible, the trenching process 2610 continues. When fringes become visible, the thick sample measurement technique, i.e., the single wavelength illumination, is utilized to measure the thickness of the remaining silicon. If the target thickness, in this example 10 μm, is not reached, the trenching and thickness measurement continues. When the target thickness is achieved at 2625, at 2630 the system is changed to the thin sample measurement technique, i.e., dual-wavelength illumination and phase difference measurement. At this step, the beam current may be lowered; however, in this example the beam current is not lowered at this step. Rather trenching is continued concurrently with thickness measurement to reach a second target thickness, in this example, 5 μm. When the second target thickness is reached at 2635, the process may proceed to either 2640 or to process steps B. At 2640 the beam current is reduced and trenching is continued while utilizing the dual-wavelength measurement technique. When the final desired thickness is achieved at 2645, trenching is stopped. On the other hand, if process steps B are selected, a mini-trench is formed within the original trench. In this case the mini-trench is, e.g., 10 μm×10 μm. The mini-trench process is started at 2650 as the beam current is reduced at 2655. Trenching is continued while utilizing the dual-wavelength thickness measurement. When the final desired thickness of the mini-trench is achieved at 2660, trenching is stopped.

While the disclosed embodiments are described in specific terms, other embodiments encompassing principles of the invention are also possible. Further, operations may be set forth in a particular order. The order, however, is but one example of the way that operations may be provided. Operations may be rearranged, modified, or eliminated in any particular implementation while still conforming to aspects of the invention. Embodiments within the scope of the present invention also include computer readable media for carrying or having computer-executable instructions or data structures stored thereon. Such computer-readable media may be any available media that can be accessed by a general purpose or special purpose computer. By way of example, and not limitation, such computer-readable media can comprise RAM, ROM, EEPROM, DVD, CD ROM or other optical disk storage, magnetic disk storage or other magnetic storage devices, or any other medium which can be used to carry or store desired program code means in the form of computer-executable instructions or data structures and which can be accessed by a general purpose or special purpose computer. A focused ion beam tool, electron beam tool, and other various integrated circuit processing tools set forth herein may be viewed as special purpose computers. When information is transferred or provided over a network or another communications link or connection (either hardwired, wireless, or a combination of hardwired or wireless) to a computer, the computer properly views the connection as a computer-readable medium. Thus, any such a connection is properly termed a computer-readable medium. Combinations of the above should also be included within the scope of computer-readable media. Computer-executable instructions comprise, for example, instructions and data which cause a general purpose computer, special purpose computer, or special purpose processing device to perform a certain function or group of functions.

All directional references (e.g., upper, lower, upward, downward, left, right, leftward, rightward, top, bottom, above, below, etc. are only used for identification purposes to aid the reader's understanding of the embodiments of the present invention, and do not create limitations, particularly as to the position, orientation, or use of the invention unless specifically set forth in the claims. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

In some instances, components are described with reference to "ends" having a particular characteristic and/or being connected to another part. However, those skilled in the art will recognize that the present invention is not limited to components which terminate immediately beyond their points of connection with other parts. Thus, the term "end" should be interpreted broadly, in a manner that includes areas adjacent, rearward, forward of, or otherwise near the terminus of a particular element, link, component, member or the like. It is intended that all matter contained in the above description or shown in the accompanying drawings shall be interpreted as illustrative only and not limiting. Changes in detail or structure may be made without departing from the spirit of the invention as defined in the appended claims.

We claim:

1. A method for removing material from an integrated circuit comprising:
   directing a particle beam onto a portion of the integrated circuit to perform milling operation and thereby remove material from the portion of the integrated circuit;
   directing light on the portion of the integrated circuit;
   receiving reflected light from the portion of the integrated circuit;
   detecting interference fringes formed from the reflected light; and
   controlling removal of material from the portion of the integrated circuit as a function of the operation of detecting interference fringes.

2. The method of claim 1 wherein the operation of directing light comprises directing a narrow bandwidth light beam onto the portion of the integrated circuit.

3. The method of claim 1 wherein the operation of directing light comprises directing a first narrow bandwidth light beam of a first wavelength onto the portion of the integrated circuit and concurrently directing a second narrow bandwidth light beam of a second wavelength onto the portion of the integrated circuit.

4. The method of claim 3 wherein the operation of detecting further comprises detecting phase change between fringes generated by the first narrow bandwidth light beam and fringes generated by the second narrow bandwidth light beam.

5. The method of claim 1 wherein the operation of detecting further comprises identifying at least one characteristic of the interference fringes.

6. The method of claim 5 wherein the at least one characteristic is selected from the group comprising: spacing of interference fringe bands, brightness of interference fringe bands, number of interference bands, and pattern of interference bands.

7. The method of claim 1 wherein the operation of controlling removal of material comprise controlling an ion dose profile of a focused ion beam system as a function of the detection of interference fringes.

8. The method of claim 1 wherein the operation of controlling removal of material comprises controlling a removal rate of material.

9. The method of claim 1 wherein the operation of controlling removal of material comprises changing the orientation of the integrated circuit.

10. The method of claim 1 wherein the operation of controlling removal of material comprises controlling delivery of chemical jet onto the portion of the integrated circuit.

11. The method of claim 1 wherein the operation of controlling comprises controlling the removal of material so as to form a substantially flat trench floor.

12. The method of claim 1 wherein the operation of controlling comprises controlling the removal of material so as to form a specified shape in a semiconductor substrate.

13. The method of claim 1 wherein the operation of controlling comprises controlling the removal of material so as to form a lens in a semiconductor substrate.

14. The method of claim 1 wherein the operation of directing light comprises directing a first narrow bandwidth light beam of a first wavelength onto the portion of the integrated circuit until a predetermined thickness measurement is achieved and thereafter directing a first narrow bandwidth light beam of a first wavelength onto the portion of the integrated circuit and concurrently directing a second narrow bandwidth light beam of a second wavelength onto the portion of the integrated circuit.

15. The method of claim 14, further comprising upon reaching the predetermined thickness, changing the characteristics of the particle beam.

16. The method of claim 15, wherein the characteristics of the particle beam comprises beam current and beam energy.

17. The method of claim 1, wherein controlling removal of material comprises controlling at least one of: particle beam dwell time, particle beam energy, and particle beam current.

18. A method for removing material from an integrated circuit comprising:
   directing a particle beam onto the integrated circuit so as to perform milling operation to remove material from the integrated circuit, the particle beam characterized by beam current and beam energy;
   detecting two concurrent beams of two different wavelengths reflected from the integrated circuit and calculating remaining thickness of layer of the integrated circuit from fringes in image obtained from the light beams;

when a first predetermined remaining thickness is achieved, changing at least one of the beam current and beam energy and thereafter continuing to direct the particle beam onto the integrated circuit and continuing to calculate remaining thickness until a final desired remaining thickness is achieved.

19. The method of claim 18, wherein continuing to calculate remaining thickness comprises detecting light beam reflected from the integrated circuit and calculating remaining thickness from phase shift in fringes in image obtained from the light beam.

20. The method of claim 18, wherein calculating the remaining thickness comprises calculating the remaining thickness based upon the amplitude of the interference fringes as a function of time.

* * * * *